(12) United States Patent
Nakashima et al.

(10) Patent No.: US 8,420,167 B2
(45) Date of Patent: Apr. 16, 2013

(54) METHOD OF MANUFACTURING A SEMICONDUCTOR DEVICE

(75) Inventors: Seiyo Nakashima, Toyama (JP); Yukinori Aburatani, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 971 days.

(21) Appl. No.: 12/382,618

(22) Filed: Mar. 19, 2009

(65) Prior Publication Data

US 2009/0191718 A1 Jul. 30, 2009

Related U.S. Application Data

(62) Division of application No. 11/987,891, filed on Dec. 5, 2007.

(30) Foreign Application Priority Data

Dec. 12, 2006 (JP) .................................. 2006-334990
Dec. 27, 2006 (JP) .................................. 2006-350882
Nov. 22, 2007 (JP) .................................. 2007-303489

(51) Int. Cl.
*C23C 16/455* (2006.01)

(52) U.S. Cl.
USPC .................................. 427/248.1; 427/255.28

(58) Field of Classification Search ............... 427/248.1, 427/255.28
See application file for complete search history.

(56) References Cited

U.S. PATENT DOCUMENTS

| | | | | |
|---|---|---|---|---|
| 4,699,805 A | * | 10/1987 | Seelbach et al. | ............... 438/680 |
| 5,658,417 A | * | 8/1997 | Watanabe et al. | ......... 156/345.31 |
| 6,444,262 B1 | | 9/2002 | Kitamura et al. | |
| 8,148,271 B2 | | 4/2012 | Ueno et al. | |
| 2003/0186517 A1 | * | 10/2003 | Takagi | ........................ 438/478 |
| 2006/0185592 A1 | * | 8/2006 | Matsuura | ...................... 118/715 |
| 2007/0051312 A1 | * | 3/2007 | Sneh | ............................ 118/719 |
| 2008/0210168 A1 | * | 9/2008 | Su et al. | ........................ 118/729 |

FOREIGN PATENT DOCUMENTS

| | | |
|---|---|---|
| JP | A-55-34690 | 3/1980 |
| JP | A-2000-68214 | 3/2000 |
| JP | A-2000-299287 | 10/2000 |
| JP | 2002-222806 * | 8/2002 |
| JP | A-2002-222806 | 8/2002 |
| JP | A-2004-59838 | 2/2004 |
| WO | WO 2007/018016 A1 | 2/2007 |

OTHER PUBLICATIONS

Nov. 4, 2011 Office Action issued in U.S. Appl. No. 11/987,891.
Office Action mailed Dec. 20, 2011 in counterpart Japanese Patent Application No. 2007-303489 (with English translation).
Office Action mailed Dec. 20, 2011 in counterpart Japanese Patent Application No. 2009-070436 (with English translation).
Office Action issued in U.S. Appl. No. 11/987,891; mailed May 14, 2012.

* cited by examiner

*Primary Examiner* — Bret Chen
(74) *Attorney, Agent, or Firm* — Oliff & Berridge, PLC

(57) ABSTRACT

A method of manufacturing a semiconductor device includes the steps of: conveying a plurality of substrates disposed in a direction perpendicular to a substrate processing surface into a processing chamber provided inside of a reaction tube, with an outer periphery surrounded by a heating device; and processing the substrates by introducing gas to a gas inlet tube provided on a side face of the reaction tube in a region for processing the substrates inside the reaction tube, so as to reach at least an outside of the heating device, and spouting the gas into the processing chamber from a slit-shaped gas spouting port disposed in a form so as to straddle at least a plurality of the substrates in a direction perpendicular to the substrate processing surface.

15 Claims, 28 Drawing Sheets

Wafer of 450mm (A)

a=30,c=285

(B)

a=225,c=285

METHOD OF MANUFACTURING A SEMICONDUCTOR DEVICE

This is a Division of application Ser. No. 11/987,891 filed Dec. 5, 2007, which claims the benefit of Japanese Patent Application Nos. 2006-334990, filed Dec. 12, 2006; 2006-350882, filed Dec. 27, 2006; and 2007-303489, filed Nov. 22, 2007. The disclosure of the prior applications is hereby incorporated by reference herein in its entirety.

BACKGROUND OF THE INVENTION

1. Field of the Invention

The present invention relates to a substrate processing apparatus and method of manufacturing a semiconductor device, and more particularly to the effective utilization thereof in a substrate processing technology in which, in a process for manufacturing a semiconductor device, a thermochemical reaction is utilized to administer a desired processing such as the fabrication of an oxide film or metal film on a substrate such as a semiconductor wafer (hereinafter also referred to as a wafer).

2. Description of the Related Art

In a process for manufacturing a semiconductor device, vertical-type semiconductor manufacturing apparatuses are sometimes employed as substrate processing apparatuses for fabricating an oxide film or metal film on a wafer.

Conventional vertical-type semiconductor manufacturing apparatuses of this type comprise a processing furnace configured from a reaction vessel and a heater in which a gas is introduced into the heated reaction vessel while being exhausted therefrom. Various methods are employed for introducing the gas into the reaction vessel.

For example, in the vertical-type semiconductor manufacturing apparatus shown in FIG. 18, a cylindrical reaction tube 2 serving as an outer tube configured from a heat-resistant material such as quartz glass is disposed roughly perpendicularly on a manifold 5 constituted from, for example, a metal material such as stainless steel. A cylindrical tube 3 serving as an inner tube is provided on the inner side of the reaction tube 2. A port 4 for holding a plurality of wafers W is provided in the inner side of the cylindrical tube 3. A gas introduction inlet 6 and an exhaust outlet 7 are provided in the manifold 5. In addition, a heater 1 is provided to surround the outer circumference of the reaction tube 2, the interior of the reaction tube 2 being able to be thermally processed thereby to a predetermined temperature. The reaction vessel is constituted from the aforementioned reaction tube 2, cylindrical tube 3 and manifold 5.

In a process of film formation, a predetermined film formation gas is introduced as indicated by the arrows through the introduction inlet 6 provided in the manifold 5 into the interior of the reaction tube 2 maintained to a predetermined pressure. The gas introduced from below the reaction tube 2 into the interior of the reaction tube is exhausted above the reaction tube 2 by way of a wafer processing space 10 and, after passing through a cylindrical space formed between the reaction tube 2 and the cylindrical tube 3, is exhausted from the exhaust outlet 7 provided in the manifold 5. By provision of the introduction inlet 6 in the manifold 5 in the manufacturing apparatus shown in FIG. 18 in this way, a film formation gas is introduced from below the wafer processing space 10 and exhausted thereabove.

In addition, while the vertical-type semiconductor manufacturing apparatus shown in FIG. 19 has the same basic configuration as the apparatus shown in FIG. 18, the following points of difference exist therebetween. For the purpose of extending the introduction inlet 6 to the wafer processing space 10, a plurality of gas nozzles 16 of different length are provided upright from the manifold 5 into the wafer processing space 10. As shown by the arrows, a film formation gas is introduced through apex portions of the gas nozzles 16 located to the side of the wafers W, and exhausted therebelow through the gas exhaust outlet 7 (for example, see Japanese Unexamined Patent Application Publication No. 2000-68214).

In addition, while the vertical-type semiconductor apparatus shown in FIG. 20 has the same basic configuration as the apparatus shown in FIG. 18, the following points of different exist therebetween. For the purpose of extending the introduction inlet 6 to the wafer processing space 10, a gas nozzle 26 is provided upright from the manifold 5. A large number of holes opposing the plurality of wafers W are provided in the gas nozzle 26, a film formation gas being introduced from the side of the wafers W and exhausted therebelow through the gas exhaust outlet 7 as shown by the arrows.

If the size of the diameters of the large number of holes provided in the gas nozzle 26 are the same, the flow rate of the film formation gas through these holes cannot be made uniform due to the gas pressure difference between holes provided in the lower part (gas upstream side) and the holes provided in the upper part (gas downstream side). Thereupon, in order to ensure uniformity of the flow rate of the film formation gas using a gas nozzle of this kind, the size of the diameter of the holes between the lower and upper parts is made different.

In addition, the reaction vessel of the vertical-type semiconductor manufacturing apparatus shown in FIG. 21 is a single tube configuration constituted from the reaction tube 2 alone, and does not comprise either a cylindrical tube or a manifold. A gas nozzle 36 that communicates with the introduction inlet 6 is provided along the outer side wall of the reaction tube 2 from below the reaction tube 2 to a ceiling portion of the reaction tube 2, a film formation gas being supplied from above the wafer processing space 10 and exhausted therebelow through the gas exhaust outlet 7 as shown by the arrows.

The following various problems are inherent to the conventional vertical-type semiconductor manufacturing apparatuses as described above.

For example, there is a problem inherent to the apparatus shown in FIG. 18 in that, because the film formation gas is introduced from below and exhausted thereabove, the film formation gas is less likely to flow to the center of the wafers W and, accordingly, differences in film thickness between the center and outer circumferential portions of the wafers are generated and the wafer in-plane film thickness uniformity is affected. There is a further problem inherent thereto in that, comparing the wafers W of positions in the lower part and the upper part of the wafer processing space 10, film formation differences between wafers located in the upper part and those in the lower part are generated due to consumption of the film formation gas occurring at the lower part and, accordingly, the wafers of the lower part are formed thicker and the wafer in-plane film thickness uniformity is affected.

In addition, in the apparatus shown in FIG. 19, even though the in-plane and interwafer film thickness uniformity are by and large satisfactory, the necessity for a plurality of gas nozzles of differing length translates to poor maintenance characteristics. In addition, because the gas nozzles 16 are provided in the wafer processing space 10, reaction product attaches to and accumulates thereon. This attachment and accumulation of a reaction product is particularly marked in the process for the formation of, for example, a $Si_3N_4$ film.

There is an additional problem in that, if the film formation conditions are altered, in most instances the changes in the film formation conditions cannot be accommodated without altering length and the number of the gas nozzles 16, while not altering the type of gas nozzles 16 restricts the conditions at which a film is able to be formed.

There is a problem inherent to the apparatus shown in FIG. 20 in that, because the gas nozzle 26 is provided in the wafer processing space 10, reaction product attaches to and accumulates thereon. More specifically, this problem resides in the necessity for a maintenance operation to be performed on the holes of the gas nozzle 26 when a reaction product attaches to and accumulates thereon. For example, when the attachment and accumulation of a reaction product is likely to occur such as in the process for the formation of a $Si_3N_4$ film, the holes block quickly and a maintenance operation on these holes must be frequently performed. There is an additional problem in that, if the film formation conditions are altered, the gas nozzle type must be altered in order to alter the holes, and not altering the type of gas nozzle restricts the conditions in which film formation is possible. A further problem resides in the increase in the size of the holes of the gas nozzle 26 caused by an etching processing performed to clean the reaction product and, accordingly, the need for the gas nozzle to be replaced to control the hole size.

In addition, there is a problem inherent to the apparatus shown in FIG. 21 in that the in-plane and interwafer film thickness uniformity are affected in the same way as described for the apparatus of FIG. 18.

A problem inherent to conventional substrate processing apparatuses in which a gas is introduced from below a reaction tube and exhausted thereabove as described above resides in the gas not being able to pass properly across the substrates and, in turn, the in-plane and intersubstrate film thickness uniformity being unable to be improved. An additional problem inherent to conventional substrate processing apparatuses in which a gas is supplied via a gas nozzle from the side of a reaction tube and exhausted thereabove resides in the in-plane and interwafer film thickness uniformity being unable to be improved without the gas inlet tube being frequently maintained and replaced.

With the problems of the conventional art described above in mind, it is an object of the present invention to provide a substrate processing apparatus and method of manufacturing a semiconductor device that, eliminating the need for the gas supply pipe to be frequently maintained and replaced, affords improved wafer in-plane and interwafer film thickness uniformity of a plurality of wafers on which a film is simultaneously formed.

SUMMARY OF THE INVENTION

A first aspect of the present invention provides a substrate processing apparatus comprising: a reaction tube having in an interior thereof a processing chamber in which a plurality of substrates disposed in a direction perpendicular to a substrate processing surface can be processed; and a heating device provided to surround an outer circumference of the reaction tube, a gas inlet tube being provided on a side face of the abovementioned reaction tube in a region for processing a substrate inside the abovementioned reaction tube, so as to reach at least an outside of the abovementioned heating device, and a gas spouting port being disposed in this abovementioned gas inlet tube in a slit form so as to straddle at least a plurality of the substrates in a direction perpendicular to the abovementioned substrate processing surface, for spouting gas from the gas inlet tube into the abovementioned processing chamber.

DESCRIPTION OF THE PREFERRED EMBODIMENTS

According to the present invention, the wafer in-plane and intersubstrate film thickness uniformity of a plurality of substrates on which a film is formed simultaneously is improved without need for the gas supply pipe to be frequently maintained and replaced.

The embodiments of the present invention will be hereinafter described with reference to the attached drawings.

<<Processing Furnace>>

Figure 1:
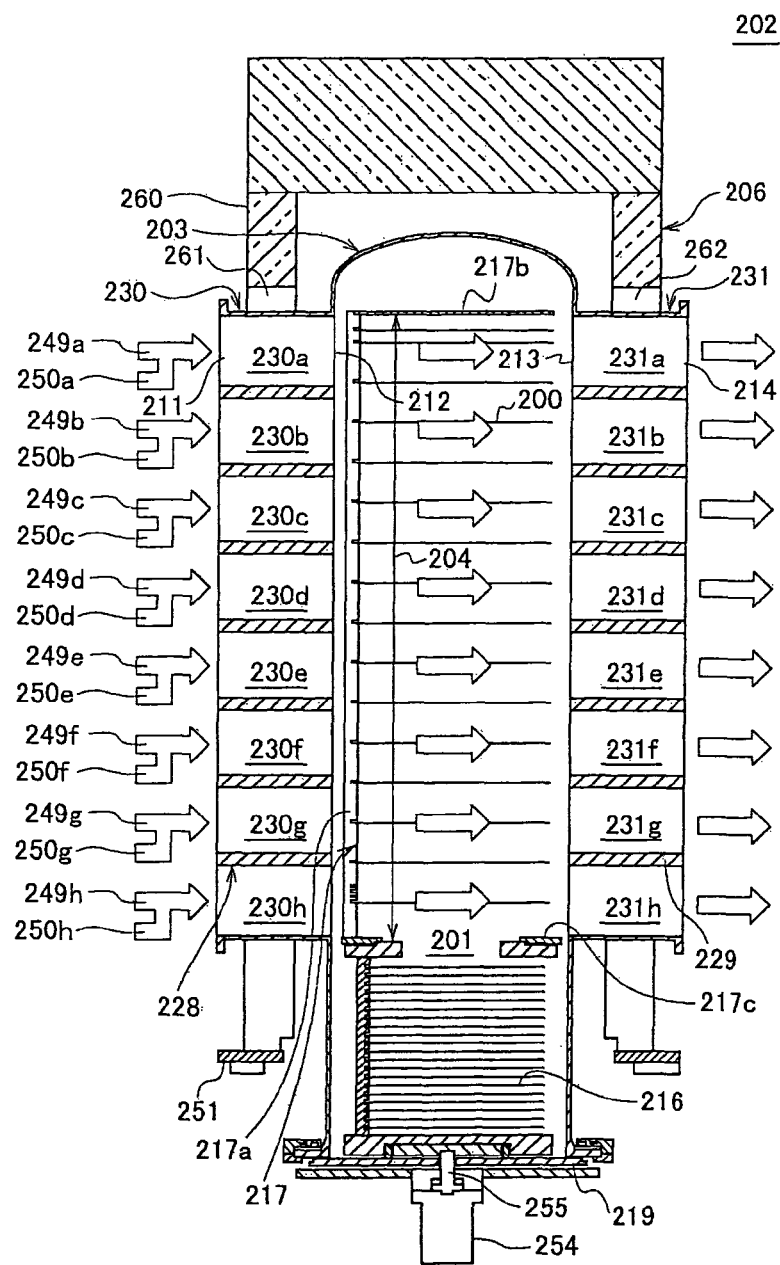
FIG. 1 is a schematic side view of a vertical-type semiconductor manufacturing apparatus of a first embodiment of the present invention.
Figure 2:
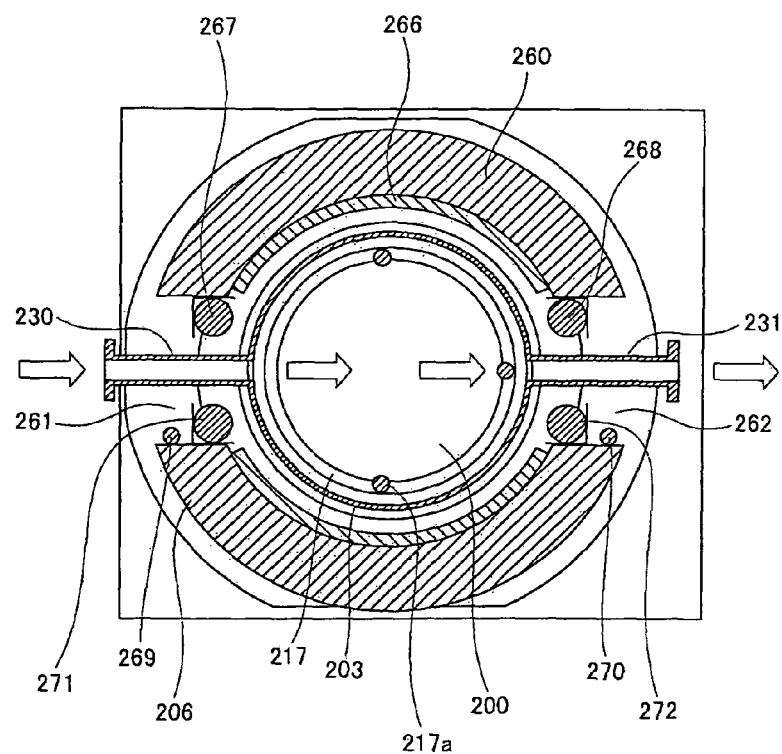
FIG. 2 is a schematic side view of the vertical-type semiconductor manufacturing apparatus of the first embodiment of the present invention.

FIG. 1 is a schematic longitudinal cross-sectional view of a processing furnace 202 of a vertical-type semiconductor manufacturing apparatus serving as a substrate processing apparatus ideal for employment in a first embodiment of the present invention. FIG. 2 is a lateral cross-sectional view of the processing furnace 202.

<<Outline of Processing Furnace>>

The vertical-type semiconductor apparatus comprises a processing furnace 202 constituted from a cylindrical reaction tube 203 and a cylindrical heater 206 serving as a heating device. The cylindrical reaction tube 203 has in its interior a processing chamber 201 in which a plurality of wafers 200 disposed in a direction perpendicular to the processing wafer surface which constitutes serving as the substrate processing surface are processable. The cylindrical heater 206 is provided to surround the outer circumference of the reaction tube 203. A gas inlet tube 230 and a gas exhaust tube 231 are provided in the side of the reaction tube 203 to extend to at least the outer side of the heater 206.

More particularly, the gas inlet tube 230 is partitioned in plurality in a direction perpendicular to the processing surface (main surface) of the wafers 200. In addition, the gas exhaust tube 231 is also partitioned in plurality in a direction perpendicular to the processing surface of the wafers 200. In addition, the gas inlet tube 230 and gas exhaust tube 231 are disposed along a straight line that passes through the diameter of the wafers 200 disposed in the reaction tube 203.

<<Reaction Tube>>

As shown in FIG. 1, the processing furnace 202 comprises a reaction tube 203. The reaction tube 203 is installed vertically. The reaction tube 203 is constituted from, for example, a heat-resistant glass material such as quartz ($SiO_2$) or silicon carbide (SiC) or the like formed in a cylindrical shape with a closed upper end and open lower end. The processing chamber 201 is formed in the interior of the reaction tube 203. The reaction tube 203 is configured to be able to process the wafers 200 with the wafers 200 disposed in a wafer processing space 204 in a state of horizontal alignment in a multiple number of regular stages in the vertical direction by means of a later-described substrate-holding tool. The wafer processing space 204 referred to here describes the space within the processing chamber 201 in which the wafers 200 are actually processable.

<<Gas Introduction Pipe•Gas Discharge Pipe>>

A gas inlet tube 230 for introducing gas into the reaction tube 203 and a gas exhaust tube 231 for exhausting gas from the reaction tube 203 are provided in the side of the reaction tube 203. The gas inlet tube 230 and gas exhaust tube 231 are formed from a material identical to that used for the reaction tube 203, and are horizontally disposed in a straight line that passes through the center of the wafers 200 disposed in the reaction tube 203. The gas inlet tube 230 and gas exhaust tube 231 are provided along the outer side of the later-described heater 206 for the purpose of introducing and exhausting the introduced gas and exhaust gas in a horizontal direction to and from the wafer processing space 204, and to provide a gas entrance region parallel to the processing surface of the wafers 200 prior to the gas reaching the interior of the reaction tube 203. In addition, a gas spouting port 212 is disposed in the gas inlet tube 230 in a slit form so as to straddle at least a plurality of wafers 200 in a direction perpendicular to the processing wafer surface, for spouting gas from the gas inlet tube 230 into the wafer processing space 204. In addition, a gas exhaust port 213 is disposed in the gas exhaust tube 231 a slit form so as to straddle at least a plurality of wafers 200 in a direction perpendicular to the processing wafer surface, for exhausting gas from the wafer processing space 204 into the gas exhaust tube 231.

Here, employing the gas inlet tube 230 and the gas exhaust tube 231 of the reaction tube 203 provided lengthwise along the side thereof, and a slit formed gas spouting port 212 formed to straddle at least a plurality of wafers 200 in a direction perpendicular to the processing wafer surface, for spouting gas from the gas inlet tube 230 to the processing chamber 201, a more streamlined gas flow is more likely to be produced and, in addition, a single direction gas flow can be produced, and the amount of gas flowing across the wafers 200 can be made uniform. Accordingly, a gas of uniform density and velocity can be fed across the wafers, and the in-plane and interwafer film thickness uniformity improved. In addition, gas can be supplied to the wafers without a drop in velocity of the gas occurring between the upstream side tip-end portion of the gas supply pipe and the substrate.

Figure 3:
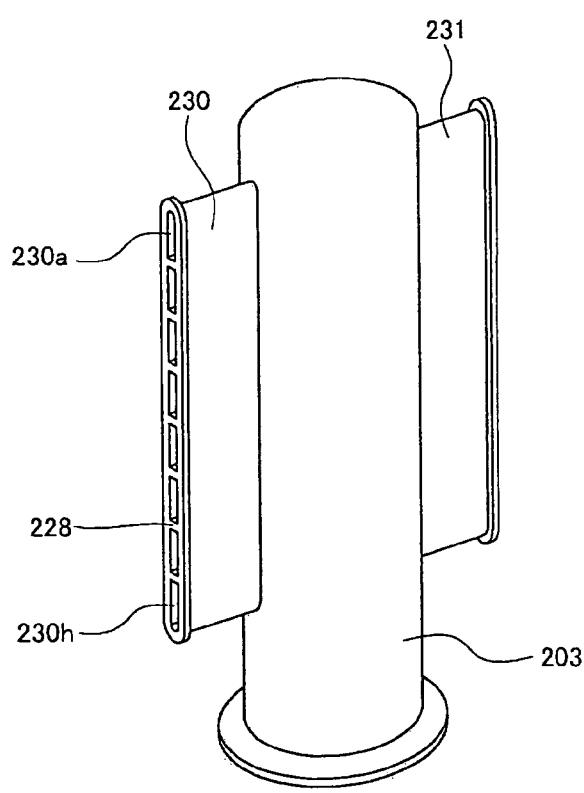
FIG. 3 is a schematic side view of a gas inlet tube and a gas exhaust tube of a reaction tube of the first embodiment of the present invention.

The gas inlet tube 230 and gas exhaust tube 231 of the first embodiment describe a flat body shape. For example, as shown in FIG. 3, they describe a long, narrow elliptical shape that traces the axial direction of the reaction tube 203. The gas inlet tube 230 and gas exhaust tube 231 are provided in positions in the side of the reaction tube 203 opposing the wafer processing space 204. The gas inlet tube 230 and the gas exhaust tube 231 are connected to the sides of the reaction tube 203 horizontally. The gas inlet tube 230 and gas exhaust tube 231 are integrally connected to the reaction tube 203 in such a way that the axes of the two pipes lie along a straight line. This integrated connection may be provided by, for example, a solder connection. By provision of the gas inlet tube 230 and gas exhaust tube 231 in the side of the reaction tube 203 in this way, the flow of gas into the processing chamber 201 is produced as a side flow.

The gas inlet tube 230 comprises gas introduction partition portions obtained by the partition thereof in plurality in a direction perpendicular to the processing surface of the wafers 200, gas being caused to flow to each of these gas introduction partition portions. In addition, a gas spouting port 212 is formed in each of these gas introduction partition portions. In the example shown in this diagram, the gas inlet tube 230 comprises eight gas introduction partition portions 230a to 230h partitioned by partition walls 228.

In addition, process gas supply portions 249a to 249h and first inert gas supply portions 250a to 250h connect to the upstream side of the plurality of gas introduction partition portions 230a to 230h respectively of the gas inlet tube 230.

By virtue of this, in the processing of wafers 200 in the reaction tube 203, a process gas can be supplied to the process gas supply portions 249a to 249h if wafers 200 are arranged in any of the positions of the wafer processing space 204 opposing the gas introduction partition portions 230a to 230h, and an inert gas, for example an $N_2$ gas, can be supplied from the first inert gas supply portions 250a to 250h if there are no wafers 200 disposed in any of the positions of the wafer processing space 204 opposing the gas introduction partition portions 230a to 230h.

The gas exhaust tube 231 comprises gas exhaust partition portions partitioned in plurality in a direction perpendicular to the processing surface of the wafers 200, exhaust from the wafer processing space 204 occurring through these gas exhaust partition portions. In addition, gas exhaust ports 213 are formed in each of the gas exhaust partition portions. In the example shown in this diagram, the gas exhaust tube 231 comprises eight gas exhaust tubes 231a to 231h partitioned by partitioned walls 229. The gas exhaust partition portions 231a to 231h and gas introduction partition portions 230a to 230h of the gas exhaust tube denoted by equivalent symbols are opposingly provided horizontally about the reaction tube 203.

As a result, in the processing of the wafers 200 in the reaction tube 203, a process gas can be exhausted from the gas exhaust tubes 231a to 231h if wafers 200 are arranged in any of the positions of the wafer processing space 204 opposing the gas introduction partition portions 231a to 231h, and an inert gas can be exhausted from the gas exhaust tubes 231a to 231h if there are no wafers 200 disposed in any of the positions of the wafer processing space 204 opposing the gas exhaust tubes 231a to 231h.

The abovementioned gas spouting ports 212 are provided only on the downstream side of the gas inlet tube 230, and preferably none of the abovementioned gas spouting ports 212 are segmented. That is to say, only one gas spouting port 212 needs to be provided at each location of a gas introduction partition of the gas inlet tube 230. While from the viewpoint of the strength of the gas inlet tube 230 the gas spouting ports 212 are preferably segmented, the provision of such segments results in greater likelihood of the gas flowing along the gas inlet tube 230 and colliding with these segments. This results in, for example, blockage of these segmented areas by the reaction product generated by pre-heating and so on of the process gas and, as these uniformly segmented areas cannot be cleaned during the cleaning process, changes over time in these segmented areas are unavoidable. A particular drawback associated with a change in size of these segmented areas over time resides in the differences in film state of films formed subsequent to these changes having occurred over time.

In contrast, the employment of non-segmented gas spouting ports 212 means that a single gas spouting port is provided for each gas introduction partition portions of the gas inlet tube 230, and that the flow rate flowing in each gas introduction partition portions is spouted through a single gas spouting port. In addition, while during rotation of the wafers 200 in which the area across the wafers 200 is regarded as the target there is tendency for the flow velocity to be slower at the center portion of the wafers 200 due to the distance from the gas spouting ports 212 to the center portion of the wafers 200 being the longest, no drop in gas flow velocity occurs when the flow rate flowing into individual gas introduction partition portions is spouted through individual gas spouting ports 212 and, furthermore, the gas caused to reach the center of the wafers 200 is of a uniform heat quantity state.

The opening area of the aforementioned gas spouting ports 212 is preferably the same as the cross-sectional area of the gas introduction partition portions in a direction perpendicular to the processing wafer surface. By virtue of this, the supply of gas can be smoothly implemented and, furthermore, the drawbacks described above can be avoided. A diaphragm portion may be provided in one of the gas spouting ports 212 to ensure the opening area of the gas spouting port 212 is less than the cross-sectional area of the gas introduction partition in a direction perpendicular to the wafer processing surface. The gas flow velocity can be further increased as a result. In this case, a change in the cross-sectional area A' of the gas spouting port 212 of the inner wall portion of the reaction tube 203 from the cross-sectional area A of the gas introduction orifice 211 of the gas inlet tube 230 of A=A' or A>A' should be established.

<<Heater>>

The processing furnace 202 comprises a heater 206 serving as a heating device. The heater 206 is cylindrical in shape and is provided to cover the outer circumference of the reaction tube 203. The heater 206 is vertically installed and supported by a heater base 251 serving as a holding plate. The reaction tube 203 is formed in a vertically-installed state supported by the heater base 251.

The heater 206 comprises a cylindrical heat-insulating body 260 of which the upper part thereof is closed and the lower part is open, a gas inlet tube introduction inlet 261 formed to lead the gas inlet tube 230 horizontally to the outer side of the heater 206 from the side of the reaction tube 203, and a gas exhaust tube exhaust outlet 262 formed to lead the gas exhaust tube 231 horizontally from the side of the reaction tube 203 to the outer side of the heater 206.

The introduction inlet 261 and exhaust outlet 262 are provided as, for example, groove-shaped notch portions formed upward from the lower end of the heat insulating body 260.

By virtue of this, when the heater 206 is mounted on the reaction tube 203 from above to cover the reaction tube 203, the outer circumference of the reaction tube 203 can be covered in the absence of any interference by the heater 206 with the gas inlet tube 230 and the gas exhaust tube 231 provided in the side of the reaction tube 203.

A result of the heater 206 covering the outer circumference of the reaction tube 203 is to cause end portions on the opposing side to the connection portion with the reaction tube of the gas inlet tube 230 and the gas exhaust tube 231 that extend to the outer side of the heater 206 to protrude outward from two sides of the heater 206.

The following advantages comparative to the case of the prior art are afforded by the formation of the introduction inlet 261 and exhaust outlet 262 as groove-like notch portions from the lower end upward of the heat-insulating body 260 as described above. When a gas nozzle or the like is provided upright from the lower end within the heater to supply gas as is the case in the prior art, gas is heated within the gas nozzle and, depending on the height of the gas nozzle and the height of the wafers arranged in the perpendicular direction, differences in the temperature of the process gas across the plurality of wafers are produced. However, as a result of notch portions that extend along the entire wafer processing region being formed in the heater and the gas inlet tube 230 and gas exhaust tube 231 being inserted in these notch portions, when the gas inlet tube 230 and the gas exhaust tube 231 are disposed horizontally to the wafers 200, the temperature of the process gas between wafer surfaces, that is to say, between a plurality of wafers being simultaneously processed, can be made uniform.

A heat-emitting body is provided in the heat-insulating body 260. As shown in FIG. 2, the heat-emitting body is configured from a first heat-emitting body 266 for heating the reaction tube 203, a second heat-emitting body 267 for heating the gas inlet tube 230, and a third heat-emitting body 268 for heating the gas exhaust tube 231.

The first heat-emitting body 266 is provided between the inner wall of the heat-insulating body 260 and the reaction tube 203. Similarly to the prior art, the first heat-emitting body 266 is segmentally provided in two areas between the inner wall of the heat-insulating body 260 and the reaction tube 203 along the inner wall of zonally divided zones in the vertical direction, and is not provided in the introduction inlet 261 and the exhaust outlet 262. The second heat-emitting body 267 is provided between the introduction inlet 261 and the gas inlet tube 230 using a fastening bracket 271. The third heat-emitting body 268 is provided between the exhaust outlet 262 and the gas exhaust tube 231 using a fastening bracket 272. The first heat-emitting body 266 is configured from, for example, a resistance-heating heater, and the second heat-emitting body 267 and third heat-emitting body 268 are configured from, for example, an infrared lamp.

<<Mechanism>>

A seal cap 219 is provided below the reaction tube 203 as a furnace opening cover for airtight-closing the lower-end opening of the reaction tube 203. A rotary mechanism 254 for rotating a later-described port 217 serving as a substrate holding tool is disposed in the opposite side of the processing chamber 201 to the seal cap 219. A rotating shaft 255 of the rotary mechanism 254 passes through the seal cap 219 and connects to the port 217, and is configured to rotate the wafers 200 as a result of the port 217 being rotated. While not shown in FIG. 1, the port 217 is able to be conveyed in and out of the processing chamber 201 by a port elevator serving as an elevating mechanism.

<<Port>>

The port 217 serving as the substrate holding tool is constituted from a heat-resistant glass material such as quartz ($SiO_2$) or silicon carbide (SiC), and is configured to hold a plurality of wafers 200 in a multiple number of regular stages in the vertical direction in a state of horizontal alignment with centers thereof aligned. More specifically, the port 217 comprises a plurality of supports 217a arranged in a cylindrical shape to support the outer circumferential portion of the wafers 200, and a ceiling plate 217b for closing an upper part between the plurality of supports 217a, and a bottom plate 217c for closing a lower part between the plurality of supports 217a.

A plurality of heat-insulating plates, in the same shape as the wafers 200, constituted from a heat-resistant glass material such as quartz ($SiO_2$) or silicon carbide (SiC) or the like serving as heat-insulating portions 216 are disposed in a lower part of the port 217, and are configured to inhibit the transfer of heat from the heater 206 below the reaction tube 203.

The processing furnace 202 of the present embodiment is configured as described above.

<<Method of Thin Film Formation>>

As one process for manufacturing a semiconductor device, a method for forming a thin film on the wafers 200 at a reduced pressure using a CVD method employing the processing furnace 202 of the configuration described above will hereinafter described.

<<Inward Conveyance Process>>

A plurality of wafers 200 are packed into the port 217 (wafer charge) and, as shown in FIG. 1, the port 217 on which the plurality of wafers 200 are held is lifted up by the port elevator and conveyed inward into the processing chamber 201 (port loading). In this state, the seal cap 219 forms a state in which it seals the lower end of the reaction tube 203. In addition, as a result of this port loading, wafers 200 are disposed in predetermined positions of the wafer processing space 204 opposing the gas introduction partition portions 230a to 230h. In this case, in order to more reliably ensure the establishment of a side flow into the wafer processing space 204 from each of the gas introduction partition portions 230a to 230h, the wafer processing space 204 is preferably partitioned to conform to the partition portions of the gas inlet tube 230 and the gas exhaust tube 231, and the wafers 200 are preferably disposed in positions opposing the partition walls 228 of the gas inlet tube 230 and the partition walls 229 of the gas exhaust tube 231.

<<Pressure, Temperature Stabilization Process>>

A vacuum exhausting is performed in the processing chamber 201 by way of the gas exhaust tube 231 to establish a desired pressure (vacuum degree) thereof. In addition, the processing chamber 201 is heated by the heater 206 to establish a desired temperature thereof. Thereafter, the wafers 200 are rotated as a result of the port 217 being rotated by the rotary mechanism 254.

<<Gas Introduction Process, Substrate Processing Process, Gas Discharging Process>>

Next, process gas is supplied from the process gas supply portions 249a to 249h and introduced into the wafer processing space 204 by way of the gas introduction partition portions 230a to 230h of the gas inlet tube 230. In this case, if wafers 200 are disposed in any position in the wafer processing space opposing the gas introduction partition portions 230a to 230h, a process gas is supplied through the process gas supply portions 249a to 249h.

If there are no wafers 200 disposed in any position in the wafer processing space opposing the gas introduction partition portions 230a to 230h, an inert gas is introduced through first inert gas supply portions 250a to 250h.

The introduced gas passes through the processing chamber 201 in the horizontal direction, and is exhausted from gas exhaust partition portions 231a to 231h of the gas exhaust tube 231. The gas passing through the processing chamber 201 comes into parallel contact with the processing surface of the rotating wafers 200, an accumulation (deposition) of the thin film on the surface of the wafers 200 occurring at this time as a result of a thermal CVD reaction.

<<Normal Pressure Restoration Process>>

Subsequent to a pre-set processing time having elapsed, an inert gas is supplied from the first inert gas supply portions 250a to 250h, the interior of the processing chamber 201 is substituted with the inert gas, and the pressure of the processing chamber 201 is restored to normal pressure.

<<Outward Conveyance Process>>

Subsequently, the seal cap 219 is lowered to open the lower end of the reaction tube 203 whereupon the processed wafers 200, in a held state on the port 217, are conveyed outward through the lower end of the reaction tube 203 (port unloading). The processed wafers 200 are then removed from the port 217 (wafer exhaust).

<<Effects of the First Embodiment>>

One or more of the following effects are exhibited by the first embodiment described above.

<<Improved In-plane and Interwafer Processing Uniformity>>

According to the first embodiment, because the gas inlet tube 230 and the gas exhaust tube 231 are horizontally connected to the side of the reaction tube 203, gas can be supplied to and exhausted from the reaction tube 203 in the horizontal direction (a side flow can be established). Accordingly, the gas supplied via the gas inlet tube 230 is supplied in a direction that is parallel to the processing surface of the wafers 200 and, accordingly, the gas flows more readily across the wafers 200.

Because the gas inlet tube 230 and the gas exhaust tube 231 are provided to extend to the outer side of the heater 206 from the side of the reaction tube 203, compared to examples when the gas inlet tube 230 and the gas exhaust tube 231 are not provided to extend to the outer side of the heater 206 such as when they are provided in the interior of the reaction tube 203 or when they are provided between the heater 206 and the reaction tube 203, the diameter of the reaction tube 203 can be reduced. Because the gas flows through a space through which gas flows readily, reducing the diameter of the reaction tube 203 results in a more ready flow of film formation gas across the wafers 200.

Furthermore, the gas inlet tube 230 and gas exhaust tube 231 are symmetrically provided about the wafers 200 disposed in the processing chamber 201. Accordingly, the in-plane and interwafer processing uniformity of the wafers 200 disposed in the processing chamber 201 is improved.

More particularly, because the gas inlet tube 230 and the gas exhaust tube 231 are disposed in a straight line to pass through the diameter of the wafers 200 disposed in the reaction tube 203 so that the gas introduction partition portions 230a to 230h that serve as gas entrance regions prior to the gas arriving into the reaction tube 203 are established in a direction parallel to the processing surface of the wafers 200, the gas flows even more readily across the wafers 200, and the in-plane processing uniformity of the simultaneously processed plurality of wafers 200 is further improved.

In addition, the gas inlet tube 230 and the gas exhaust tube 231 are partitioned in plurality in a direction perpendicular to the processing surface of the wafers 200 into gas introduction partition portions 230a to 230h into which the film formation gas flows. In addition, by virtue of the process gas introduced from each of the plurality of gas introduction partition portions 230a to 230h of the gas inlet tube 230 being exhausted through the plurality of gas exhaust partition portions 231a to 231h of the gas exhaust tube 231, the film formation gas flows in parallel as shown by the arrows into a plurality of areas of the wafer processing space 204 in a direction perpendicular thereto. Because, as a result, the process gas is supplied in a horizontal direction to the wafers 200 and exhausted in a horizontal direction therefrom, the process gas is smoothly supplied across the wafers 200. Accordingly, the interwafer processing uniformity of a plurality of simultaneously processed wafers 200 is further improved.

The similar provision of the gas introduction partition portions 231a to 231h in the direction of lamination of the wafers 200 in the gas exhaust tube 231 in addition to the partition portions provided in the gas inlet tube 230 ensures further improvement in the in-plane and interwafer processing uniformity of the plurality of wafers 200.

<<Loading Effect>>

In addition, by virtue of the film formation gas being introduced in a direction parallel to the processing surface of the wafers 200 and the film formation gas being caused to flow uniformly between the large number of wafers 200 on which a film is being simultaneously performed, a loading effect (a phenomenon in which the gas amount decreases accompanying the advancement of, for example, the film formation gas through the processing chamber due to the film formation gas reacting with the wafers in the processing chamber and, comparing the wafers on the film formation gas upstream side with those on the downstream side, the film formed on the wafers on the upstream side is thicker than the film formed on the wafers on the downstream side) can be prevented.

<<Dummyless>>

In addition, a dummyless processing is facilitated by the absence of a loading effect. This dummyless processing will be hereinafter described.

A shift in recent years in the production mode employed in methods of manufacturing IC from the large-volume production of a small number of article types to the small-volume production of a large number of article types has led to a demand for reduced time from the start to the completion of the manufactured article. For example, in CVD apparatuses employed for the large-volume manufacture of a single manufactured article such as a DRAM, the number of wafers 200 loaded on the port 217 is referred to as the port maximum loading number. However, for small-volume production of a large number of article types such as for system LSI, it is difficult to maintain the number of wafers 200 loaded on the port to the port maximum loading number and, because this number is sometimes only 50 to 70% of the port maximum loading number and, in extreme cases, a mere 2 or 3 wafers may be loaded, there need for some kind of processing to be implemented.

In such cases, in order for variations between films of a single processing operation (hereinafter referred to as a batch), a uniformity control of the processing conditions between batches is normally executed. For example, if the number of wafers (hereinafter referred to as manufactured wafers) processed in a single batch is reduced, a control for replacing the manufactured wafers in a number equivalent to the number of wafers not formed as manufactured wafers (hereinafter referred to as dummy wafers) based on the batch processing conditions at which a reduction in number occurred being made identical to batch processing conditions in which no reduction in number occurs is executed.

According to the present embodiment, because the amount of film formation gas supplied is made uniform for all wafers, the need for a dummy wafer to be packed into the processing chamber 201 when the film formation processing is performed is eliminated (dummyless processing), the film formation gas flows into only the gas introduction partition portions in which manufactured wafers on which a film formation processing is to be performed are present, a purge gas flows from the gas introduction partition portions into the other gas introduction partition portions in which there are no dummy wafers packed, and the overall gas flow rate is regulated for film formation. In addition, gas is introduced into each gas introduction partition portion and, by provision of flow rate control means for the control of the gas introduction flow rate of each gas introduction partition portion, the film formation at each partition can be better controlled.

By virtue of this, the film formation gas usage amount can be suppressed and, because the need for a dummy wafer to be provided for packing into the partition portions is eliminated, the operating costs (running costs) and so on thereof can be markedly reduced. In addition, exhausting is performed from each gas exhaust partition portion and, by provision of automatic pressure control means and implementation of an automatic pressure control (APC) for each, the film formation of each partition can be better controlled.

In addition, when the loading percentage of the wafers 200 on the port is low, because a process gas is supplied through the process gas supply portions 249a to 249h if the wafers 200 are disposed in any position in the wafer processing space opposing the gas introduction partition portions 230a to 230h, and an inert gas is supplied through the first inert gas supply portions 250a to 250h if the wafers 200 are disposed in any position in the wafer processing space opposing the gas introduction partition portions 230a to 230h, the amount of process gas used can be reduced. That is to say, as an inert gas rather than a process gas is supplied through the partition portions of the gas supply pipe to positions in the wafer processing space in which there are no wafers disposed, attachment and accumulation of a reaction product at these partition portions in the reaction tube can be suppressed.

<<Heater Heating>>

In addition, because the process gas is heated by a first heat-emitting body 266 and a second heat-emitting body 267 at entrance regions of the gas introduction partition portions 230a to 230h of the gas inlet tube 230, the process gas can be sufficiently pre-heated to a temperature at which is reactable whereupon, in turn, the wafer processing can be efficiently performed. In addition, liquefaction in the gas inlet tube 230 when starting materials and so on that liquefy easily at room temperature and normal pressure are employed as the gas starting materials can be prevented. In addition, because the third heat-emitting body 268 heats the exhaust gas exhausted from the gas exhaust tube 231, attachment of the reaction product to the gas exhaust tube 231 can be prevented.

Furthermore, even when gas introduction notched portions for the gas inlet tube 230 and the gas exhaust tube 231 are formed in the heater 206 by virtue of the second heat-emitting body 267 and the third heat-emitting body 268 being provided in addition to the first heat-emitting body 266 as heat-emitting bodies, because the second heat-emitting body 267 and the third heat-emitting body 268 are separately controllable to the main first heat-emitting body 266 with respect to the heat that escapes from the introduction port and the exhaust port are provided, the generation of cold spots in these gas supply pipe notched portions can be effectively suppressed.

<<Pressure Resistance, Heat Resistance Improvement>>

In addition, because partition walls 228, 229 are provided in a vertical direction in the interior of the gas inlet tube 230 and the gas exhaust tube 231, the pressure resistance and heat resistance of the gas inlet tube 230 and the gas exhaust tube 231 and, in turn, the reaction tube 203 connected thereto is improved.

<<First Embodiment Modifications>>

The following range of modifications can be made to the first embodiment of the present invention described above.

<<Gas Introduction Pipe and Gas Discharge Pipe Modifications>>

While the first embodiment described above describes, as shown in FIG. 3, a case in which a plurality of gas introduction partition portions 230a to 230h and gas exhaust partition portions 231a to 231h are integrally provided in a single gas inlet tube 230 and a single gas exhaust tube 231a as a result of these long, elliptically-shaped pipes being partitioned in the vertical direction by partition walls 228, 229, the present invention is not limited thereto.

Figure 4:
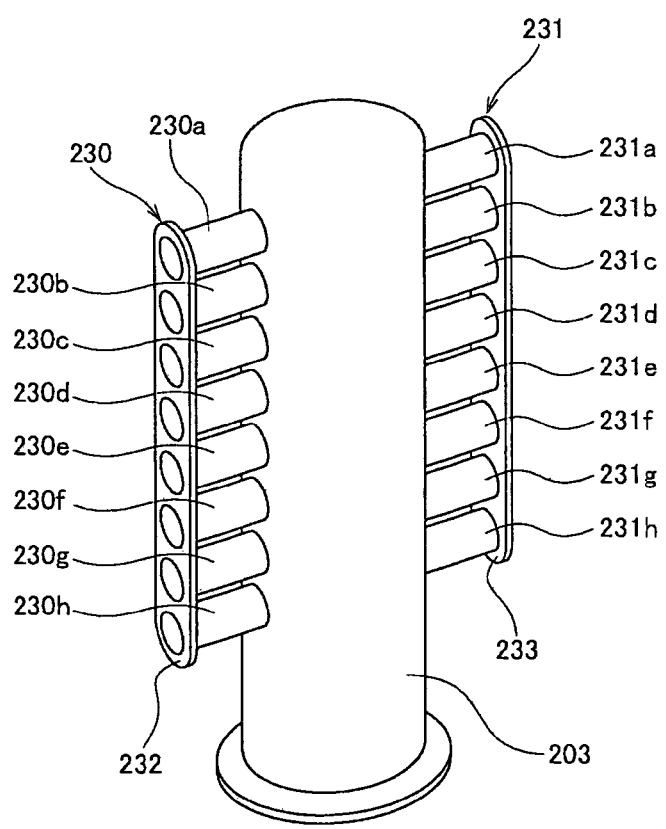
FIG. 4 is a schematic view of a gas inlet tube and a gas exhaust tube of a reaction tube of a first modification of the first embodiment.

For example, as in a first modification thereof shown in FIG. 4, on the basis of a plurality of gas inlet tubes 230 and gas exhaust tubes 231 of a cylindrical shape being arranged in rows in the vertical direction of the reaction tube 203 and joined by way of common flanges 232, 233, the plurality of gas introduction partition portions 230a to 230h and gas exhaust partition portions 231a to 231h may be independently provided.

Figure 5:
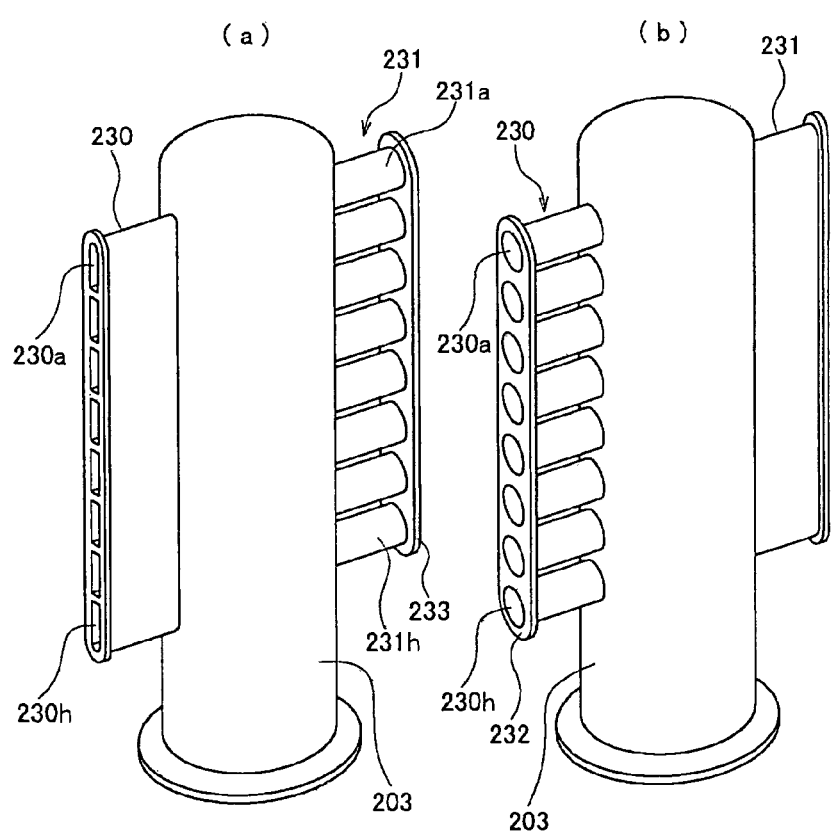
FIG. 5 is a schematic view of a gas inlet tube and a gas exhaust tube of a reaction tube of a second and a third modification of the first embodiment.

In addition, as in the modification shown in FIG. 5, an arrangement in which a plurality of partition portions are integrally provided in one of either the gas inlet tube 230 or the gas exhaust tube 231, and in which a plurality of partition portions are independently provided in the other may be employed. FIG. 5A shows a second modification which describes an arrangement in which a plurality of gas introduction partition portions 230a to 230h are integrally provided in the gas inlet tube 230 and a plurality of gas exhaust partition portions 231a to 231h are independently provided in the gas exhaust tube 231. FIG. 5B shows a third modification which describes an arrangement in which a plurality of gas introduction partition portions 230a to 230h are independently provided in the gas inlet tube 230 and a plurality of gas exhaust partition portions 231a to 231h are integrally provided in the gas exhaust tube 231.

Furthermore, the shape of the gas inlet tube 230 and the gas exhaust tube 231 is not limited to the shape shown in the examples of FIG. 3 to FIG. 5. In addition, the arrangement and number of partition portions is not limited to the arrangement and number shown in the examples of these drawings.

<<Plasma Excitation>>

Figure 6:
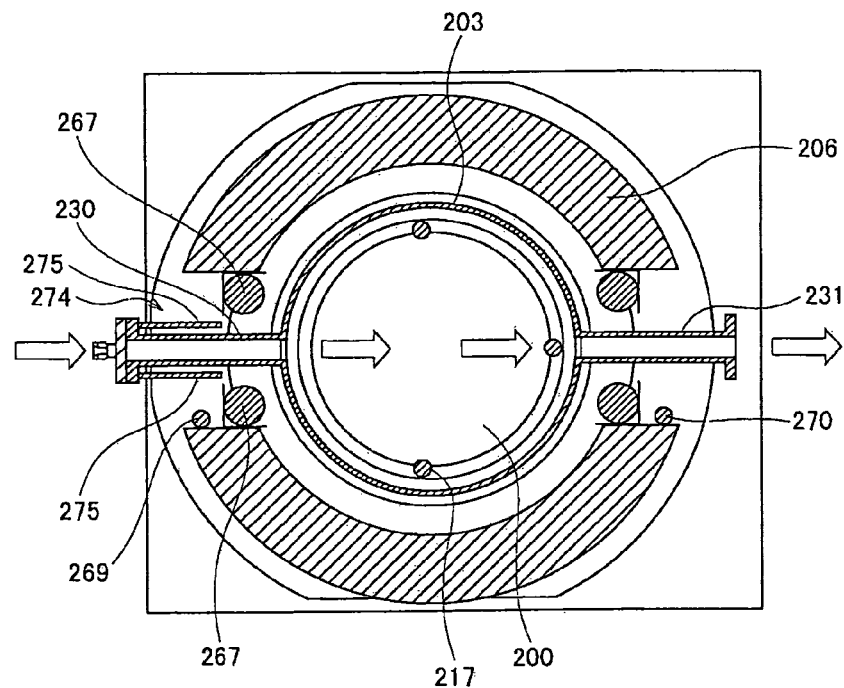
FIG. 6 is a schematic plan view of a plasma vertical-type semiconductor manufacturing apparatus of a fourth modification of the first embodiment.

In some CVD methods the process gas introduced into the reaction tube is subject to plasma excitation to promote the reactivity thereof. FIG. 6 is a lateral cross-sectional view of a processing furnace of a fourth modification that comprises this plasma excitation function.

As shown in FIG. 6, a plasma excitation source 274 is provided in the gas inlet tube 230. In order to avoid interference between the gas inlet tube 230 and the second heat-emitting body 267 provided in the reaction tube connecting portion side, the plasma excitation source 274 is provided in a side opposing the reaction pipe connection portion side of the gas inlet tube 230. The plasma excitation source 274 comprises, for example, parallel flat plate electrodes 275.

The parallel flat plate electrodes 275 are provided along the flat two side walls of the gas inlet tube 230 to sandwich therebetween the left and right faces of the gas inlet tube 230.

Figure 7:
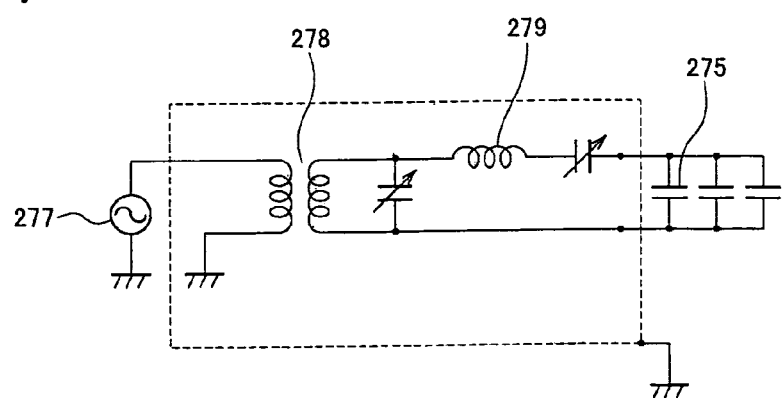
FIG. 7 is a plasma generation circuit diagram of the fourth modification of the first embodiment.

As shown in FIG. 7, the plasma excitation source 274 is configured from, for example, an alternating current power supply 277, an LC circuit 279 for generating an oscillating voltage signal of the alternating current power supply 277 of which the voltage rise thereof is produced by a transistor 278, and the parallel flat plate electrodes 275 to which an oscillating power from the LC circuit 279 is imparted.

Plasma is generated in gas entrance regions of the gas introduction partition portions of the gas inlet tube 230 by the plasma excitation source 274 described above. The plasma generated in the gas entrance regions excites the gas introduced through the gas inlet tube 230. This excitation gas of increased reactivity affords the formation of a film on the wafers 200, and is then exhausted from the gas exhaust tube 231.

Because the parallel flat plate electrodes 275 are disposed outside the processing chamber and provided to surround the long, narrow elliptically-shaped gas inlet tube 230 in this way, the gas in the gas inlet tube 230 is created as a plasma, and then the plasma-excited gas can be easily supplied to the substrate.

<<Reduction in Film Formation Gas Usage Amount>>

Figure 8:
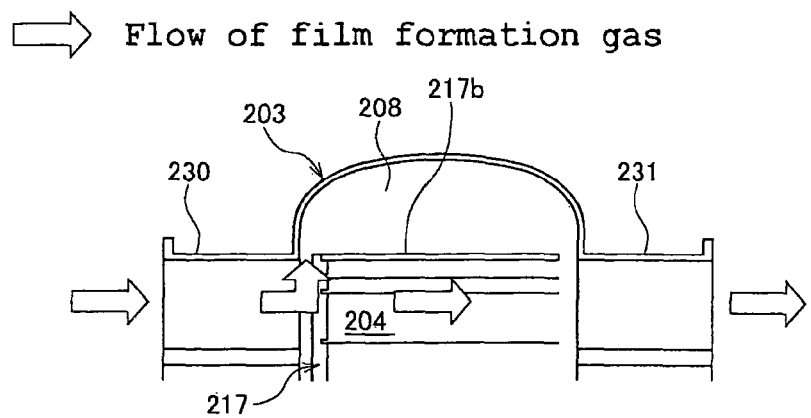
FIG. 8 is a schematic side view of a reaction tube upper part of a fifth modification of the first embodiment.

However, as in the fifth modification shown in FIG. 8, to ensure the satisfactory pressure resistance of the reaction tube 203, the upper part of the cylindrical reaction tube 203 having a processing chamber in its interior in which a plurality of wafers 200 are processable is normally configured as a dome shape. A problem inherent thereto resides in the film formation gas flowing into the dome-shaped upper space 208 of the reaction tube 203 and being exhausted without contributing to film formation. There is a particular problem inherent to the employment of a side-flow type reaction tube 203 in that, because a flow of film formation gas into the uppermost level partition is produced, there is an increased film formation gas usage amount at this partition which creates a flow rate imbalance with respect to the gas flow rate flowing through the other partition levels. An additional problem resides in the attachment and accumulation of reaction product on the inner wall of the upper space 208 when the film formation gas flows into the upper space 11.

Thereupon, in the fifth modification shown in FIG. 8, the ceiling plate 217b of the port 217 is disposed at the same height as the upper end of the gas inlet tube 230. By virtue of the ceiling plate 217b of the port 217 being disposed at the same height as the upper end of the gas inlet tube 230, the side flow of the process gas supplied from the gas inlet tube 230 into the reaction tube 203 is undisturbed and, accordingly, readily flow of the process gas from above the ceiling plate 217b of the gas inlet tube 230 is inhibited.

However, the configuration of the fifth modification as shown in FIG. 8 does not imply that the path (gas flow-passing space) to the upper space 208 of the reaction tube 203 is interrupted, and there remains scope for further improvement thereto.

Thereupon, in an improved mode thereof, a gas interrupting portion for interrupting the flow of gas into the upper space 208 is provided above the wafer processing space 204 of the reaction tube 203 in addition to the ceiling plate 217b of the port 217 disposed at the same height as the upper end of the gas inlet tube 230. In this case, the gas interrupting portion may be either provided in the interior of the reaction tube 203, or configured as the outer wall of the reaction tube 203. The provision of the gas interrupting portion above the wafer processing space 204 of the reaction tube 203 prevents flow of the process gas above the wafer processing space 204 of the reaction tube 203 and, accordingly, resolves the problems described above.

When a gas interrupting portion is provided above the wafer processing space 204 of the reaction tube 203, a reinforcing member extending in a direction perpendicular to the processing surface of the wafers 200 for reinforcing the pipe wall of the reaction tube 203 is provided. The provision of a reinforcing member in the gas interrupting portion improves the pressure resistance of the reaction tube 203.

Figure 9:
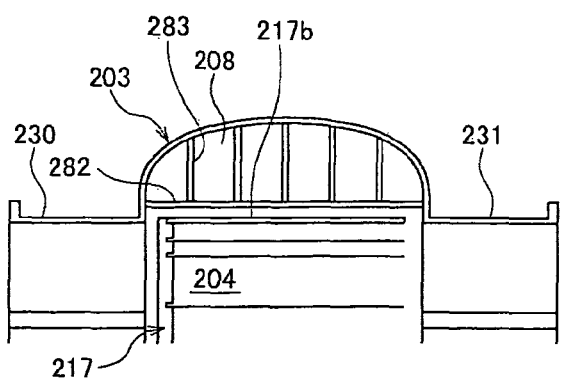
FIG. 9 is a schematic side view of a reaction tube upper part of a sixth modification of the first embodiment.

In a configuration in which the abovementioned gas interrupting portion is provided above the wafer processing space 204 of the reaction tube 203 as in, for example, a sixth modification shown in FIG. 9, a partition panel 282 is provided as a gas interrupting portion between the upper space 208 (upper region) of the reaction tube 203 and the wafer processing space 204 (wafer processing region). A plurality of ribs 283 serving as reinforcing members for reinforcing the wall of the reaction tube 203 extending in a direction perpendicular to the processing surface of the wafers 200 are provided between the partition panel 282 and the wall of the reaction tube 203 for reinforcing the wall of the reaction tube 203. The provision of a partition panel 282 in the inner side of the reaction tube 203 in this way allows for the effective utilization of a known dome-shaped upper part reaction tube 203.

Figure 10:
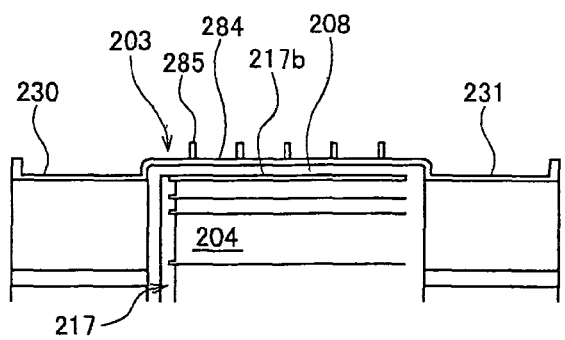
FIG. 10 is a schematic side view of a reaction tube upper part of a seventh modification of the first embodiment.

In a configuration in which the gas interrupting portion is configured as the outer wall of the reaction tube 203 as in, for example, a seventh modification shown in FIG. 10, the upper part of the reaction tube 203 is formed in a flat shape, and a flat upper part 284 thereof serves as the gas interrupting portion. Ribs 285 serving as reinforcing members are provided upright in the outer side of the flat upper part 284. Configuring the wall of the reaction tube 203 with a flat upper part 284 in this way affords a reaction tube 203 of simpler configuration than the configuration thereof shown in FIG. 9.

The employment of a reaction tube 203 in which ribs 283, 285 are employed to afford satisfactory pressure resistance of the sixth and seventh modifications described above inhibits the flow of the process gas supplied from the gas inlet tube 230 into the reaction tube 203 upward from the ceiling plate 217b of the reaction tube 203. Accordingly, the film formation gas usage amount and the frequency of implementation of a cleaning process for cleaning the reaction product that attaches to the wall surface facing the upper space 208 can be reduced. In addition, the cleaning gas usage amount can be reduced.

While in the sixth and seventh modifications shown in FIG. 9 and FIG. 10 described above the partition panel 282 and flat upper part 284 reinforced by the ribs 283, 285 are provided as means for preventing the flow of film formation gas into the upper space 208 of the reaction tube 203, the configuration is not limited thereto.

Figure 11:
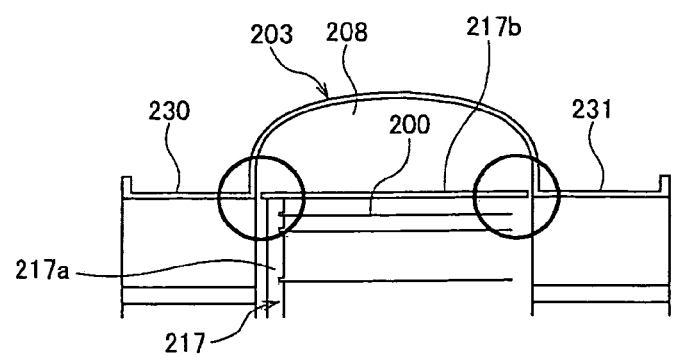
FIG. 11 is a schematic side view of means for preventing film formation gas flowing into the reaction tube upper part of an eighth modification of the first embodiment.

For example, in an eighth modification shown in FIG. 11, in addition to the ceiling plate 217b of the port 217 being disposed at the same height as the upper end of the gas inlet tube 230, as indicated by the circle symbols, the outer diameter of the ceiling plate 217b of the port 217 is formed in a size that is at least the size of the wafers 200 in order to reduce the gap between the ceiling plate 217b and the reaction tube 203. More preferably, the gap with the reaction tube 203 inner wall is further reduced by increasing the outer diameter of the ceiling plate 217b beyond the cylindrical diameter of the cylindrical shape defined by the plurality of supports 217a.

Figure 12:
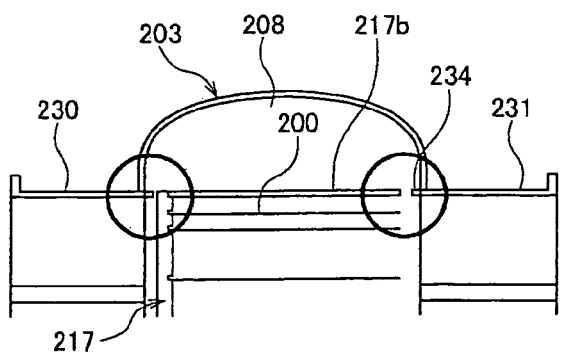
FIG. 12 is a schematic side view of means for preventing film formation gas flowing into the reaction tube upper part of a ninth modification of the first embodiment.

In addition, in a ninth modification shown in FIG. 12, in addition the ceiling plate 217b of the port 217 being disposed at the same height as the upper end of the gas inlet tube 230, as indicated by the circle symbols, the upper end of the gas inlet tube 230 comprises a protruding portion 234 that protrudes in a diametric direction from the inner wall surface of the reaction tube 203 in order to reduce the gap with the ceiling plate 217b.

While there is no comparative improvement in pressure resistance of the reaction tube 203 afforded by the eighth and ninth modifications with respect to the sixth and seventh modifications, these embodiments afford the prevention of the flow of the film formation gas into the upper space 208 of the reaction tube 203 in a comparative simpler configuration.

In addition, as shown in FIG. 12, a protruding portion 234 that protrudes inward from the inner wall surface of the reaction tube 203 provided in the upper end of the gas exhaust tube 231 inhibits the process gas being exhausted from the reaction tube 203 into the gas exhaust tube 231 from flowing readily into the upper space 208 of the reaction tube 203.

While the embodiments described above address the problem of gas flowing into the upper space 208 of the reaction tube 203, gas flows not only into the upper space 208 but also into a lower space 210 of the reaction tube 203.

Figure 13:
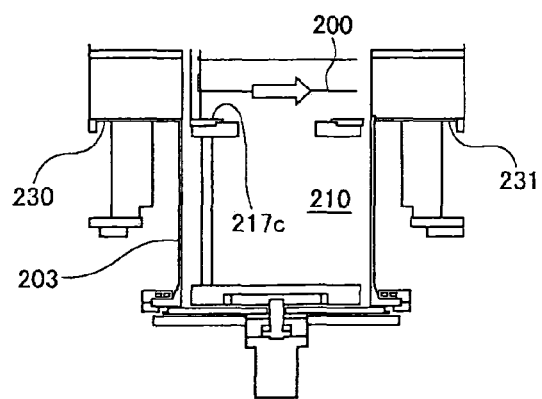
FIG. 13 is a schematic side view of means for preventing film formation gas flowing into the reaction tube upper part of a tenth modification of the first embodiment.

Thereupon, as in a tenth modification shown in FIG. 13, a bottom plate 217c of the port is disposed at an equivalent height to the lower end of the gas inlet tube 230. By virtue of the bottom plate 217c of the port 217 being disposed at equivalent height to the lower end of the gas inlet tube 230, the flow of a process gas supplied from the gas inlet tube 230 to the reaction tube 203 below the bottom plate 217c of the reaction tube 203 is inhibited.

However, the tenth modification shown in FIG. 13 does not imply that the path (gas flow-passing space) to the lower space 210 of the reaction tube 203 is interrupted, and there remains scope for further improvement thereto.

Figure 14:
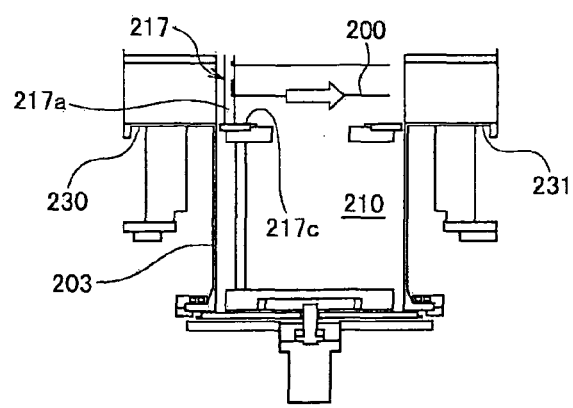
FIG. 14 is a schematic side view of means for preventing film formation gas flowing into the reaction tube upper part of an eleventh modification of the first embodiment.

Thereupon, as in an eleventh modification shown in FIG. 14, the outer diameter of the bottom plate 217c of the port 217 is formed of a size that is at least the size of the wafers 200 in order to reduce the gap between the bottom plate 217c and the reaction tube 203. More preferably, the gap with the reaction tube 203 inner wall is further reduced by increasing the outer diameter of the bottom plate 217c beyond the cylindrical diameter of the cylindrical shape defined by the plurality of supports 217a.

Figure 15:
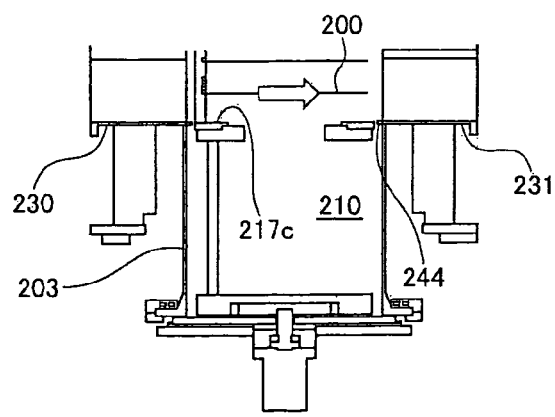
FIG. 15 is a schematic side view of means for preventing film formation gas flowing into the reaction tube upper part of a twelfth modification of the first embodiment.

In addition, in a twelfth modification shown in FIG. 15, in addition to the bottom plate 217c of the port 217 being disposed at the same height as the upper end of the gas inlet tube 230, the lower end of the gas inlet tube 230 comprises a protruding portion 244 that protrudes in a diametric direction from the inner wall surface of the reaction tube 203 to reduce the gap with the bottom plate 217b. Accordingly, the flow of process gas supplied from the gas inlet tube 230 into the reaction tube 203 below the bottom plate 217c of the port 217 of the reaction tube 203 can be inhibited.

In addition, as shown in FIG. 15, a protruding portion 244 that protrudes inward from the inner wall surface of the reaction tube 203 provided in the lower end of the gas exhaust tube 231 inhibits the process gas being exhausted from the gas inlet tube 230 into the gas exhaust tube 231 from flowing readily below the bottom plate 217c of the reaction tube 203.

Accordingly, the film formation gas usage amount and the frequency of implementation of a cleaning process for cleaning the reaction product that attaches to the wall surface facing the lower space 210 can be reduced. In addition, the cleaning gas usage amount can be reduced. Furthermore, compared to the formation of a port 217 on which wafers 200 are disposed in plurality in a direction perpendicular to the wafer processing surfaces, the provision of a protruding portion 244 that protrudes inward from the inner wall surface of the reaction tube 203 in the upper end and lower end of the gas inlet tube 230 and gas exhaust tube 231 affords a simpler structure.

<<Purge Gas>>

According to the embodiments described above, flow of gas into the upper space 208 and lower space 210 of the reaction tube 203 can be reliably prevented. However, there is scope for improvement in terms of more reliably preventing the flow of gas into the upper space 208 and lower space 210 of the reaction tube 203.

Figure 16:
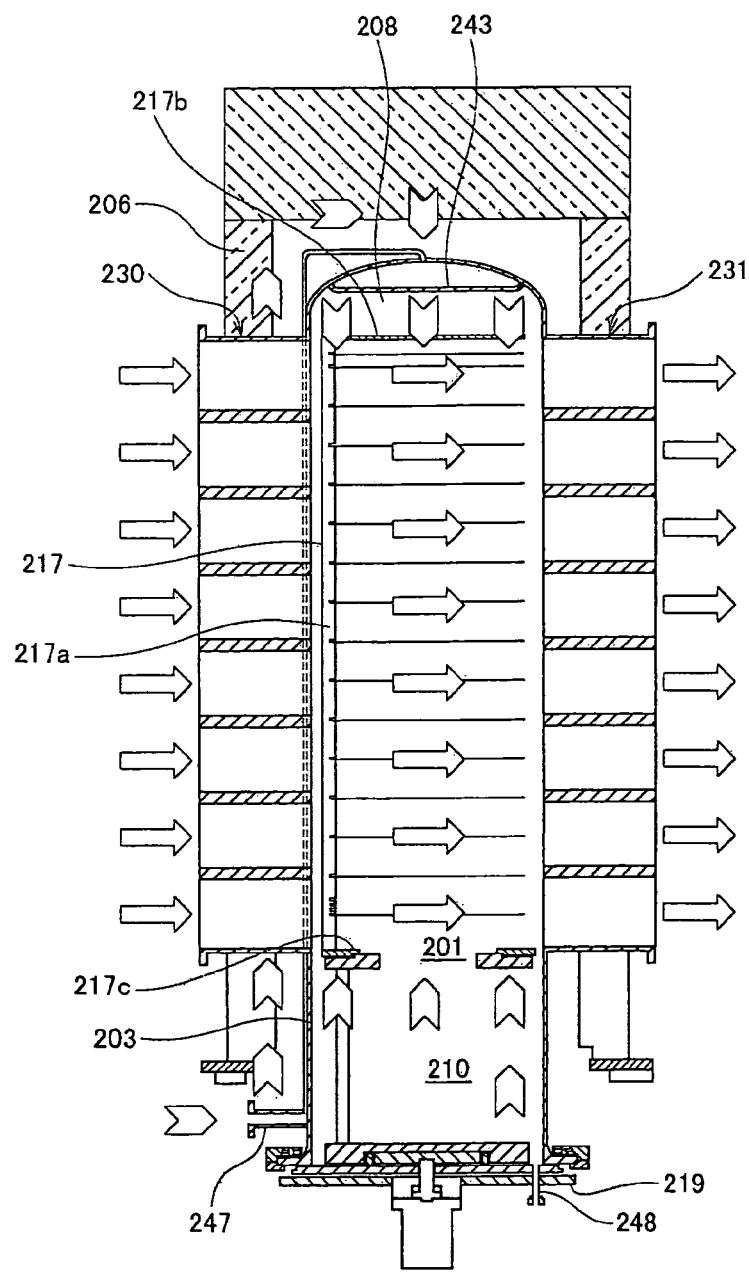
FIG. 16 is a schematic side view of means for preventing film formation gas flowing into the reaction tube upper part of a thirteenth modification of the first embodiment.

Thereupon, in a thirteenth modification shown in FIG. 16, a purge gas-introducing gas nozzle 247 serving as a second inert gas supply portion is provided separately to the gas inlet tube 230 for film formation gas. This gas nozzle 247 is provided to extend upward from below the reaction tube 203 along the outer side wall of the reaction tube 203 to communicate with the upper space 208 of the dome-shaped apex portion. A shower plate 243 in which a large number of holes are formed is provided in the upper space 208 of the reaction tube 203. An inert gas, for example an $N_2$ gas, is introduced through the gas nozzle 247 as shown by the arrows into the upper space 208 of the reaction tube 203, supplied above the ceiling plate 217b of the port 217 by way of the large number of holes provided in the shower plate 243, and prevents flow of film formation gas above the ceiling plate 217b. While the second inert gas supply portion is provided to supply gas by way of the shower plate 243 into the upper space 208 within the reaction tube 203, this gas supply system is not limited thereto. That is, the provision of the second inert gas supply portion need only ensure the supply of an inert gas above the wafer processing space of the reaction tube 203.

It is preferable that a gas supply pipe 248 serving as a third inert gas supply portion is connected to a seal cap 219 in such a way as to communicate with the processing chamber 201 and, as shown by the arrows, that an inert gas such as an $N_2$ gas is introduced through the gas supply pipe 248 to prevent flow of film formation gas into the lower space 210 of the bottom plate 217c of the port 217. While the third inert gas supply portion is provided so that a gas is supplied from the gas supply pipe 248 connected to the seal cap 219, this gas supply system is not limited thereto. That is, the provision of the third inert gas supply portion need only ensure the supply of an inert gas below the wafer processing space of the reaction tube 203.

Because the introduction of a purge gas through these upper and lower parts of the reaction tube 203 affords the supply of a purge gas from the opposite direction to the direction of film formation gas supply and exhaust and interruption to the supply of film formation gas to regions other than the wafer processing regions and, because the film formation gas flow rate is adjusted for film formation, the film formation gas usage amount, the frequency of implementation of the cleaning process for cleaning the reaction product attached to the side wall and, in turn, the cleaning gas usage amount can be further reduced.

It is preferable that a purge gas be introduced through the upper part and/or lower part of the reaction tube 203 at times other than during film formation and, when a purge gas is used for purging following film formation or atmosphere restoration, the film formation time can be shortened. In addition, while the embodiments described above describe examples of film formation performed under a reduced pressure, the pressure produced in the furnace is not limited to the pressure employed for thermal processing and, for example, film formation, oxidation and annealing treatments may be performed under atmospheric pressure.

Figure 22:
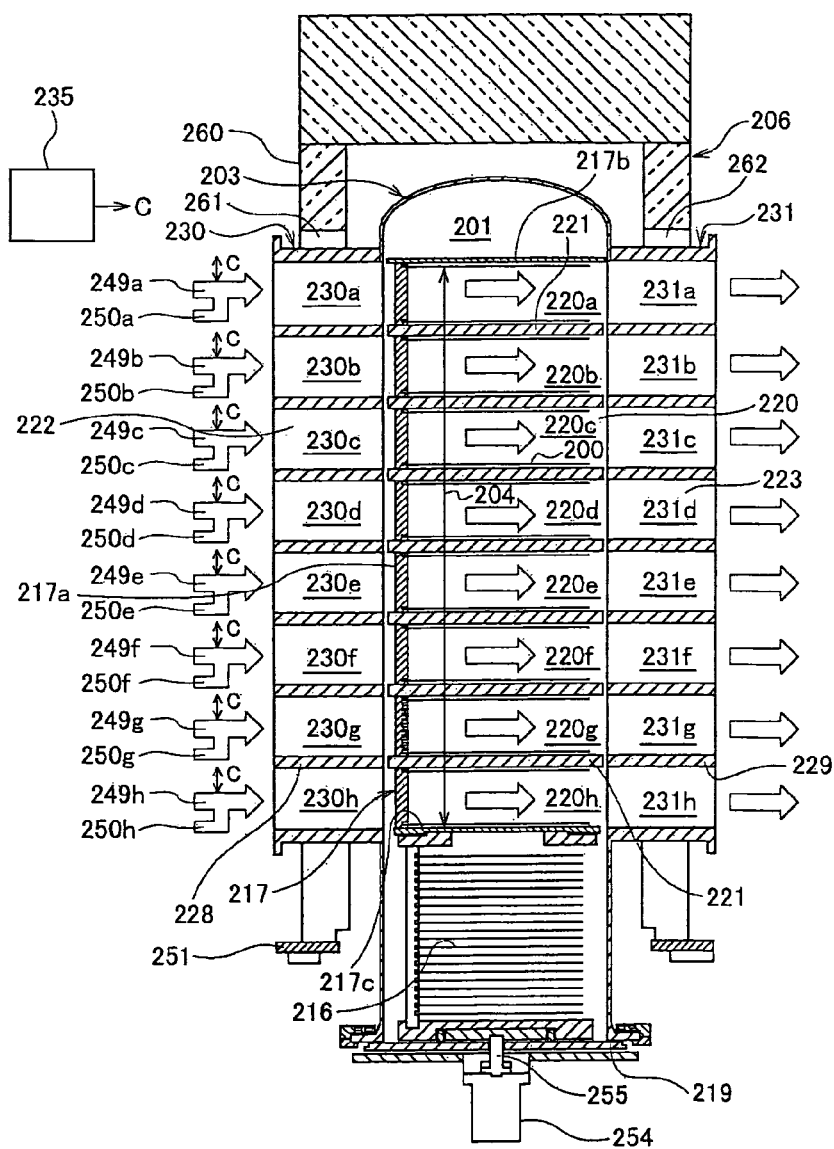
FIG. 22 is a schematic side view of a vertical-type semiconductor manufacturing apparatus of a second embodiment of the present invention.

FIG. 22 is a schematic longitudinal cross-sectional view of a processing furnace 202 of a vertical-type semiconductor manufacturing apparatus serving as a substrate processing apparatus ideal for employment in the second embodiment of the present invention.

<<Processing Furnace>>

The processing furnace shown in FIG. 22 describes a separate mode of processing furnace to the processing furnace shown in FIG. 1. The basic configuration of the processing furnaces is the same, and the constituent elements of this processing furnace correspond to those of the processing furnace of the first embodiment described earlier with reference to FIG. 1. The processing furnace shown in FIG. 22 differs from the processing furnace shown in FIG. 1 in the point that partition walls equivalent to those provided in the gas inlet tube and the gas exhaust tube are provided in the port.

Figure 23:
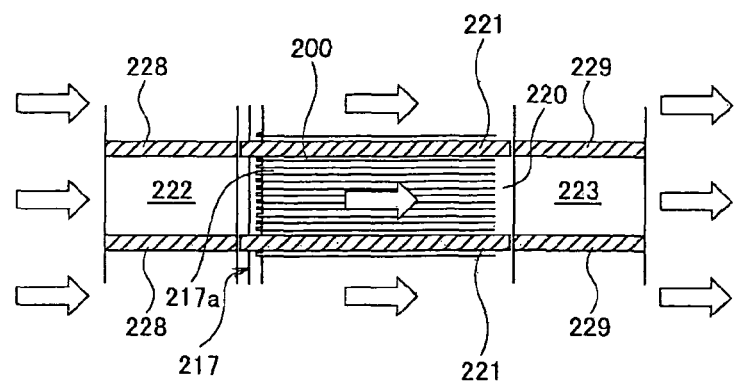
FIG. 23 is a main part expanded view of the vertical-type semiconductor manufacturing apparatus of the second embodiment of the present invention.
Figure 24:
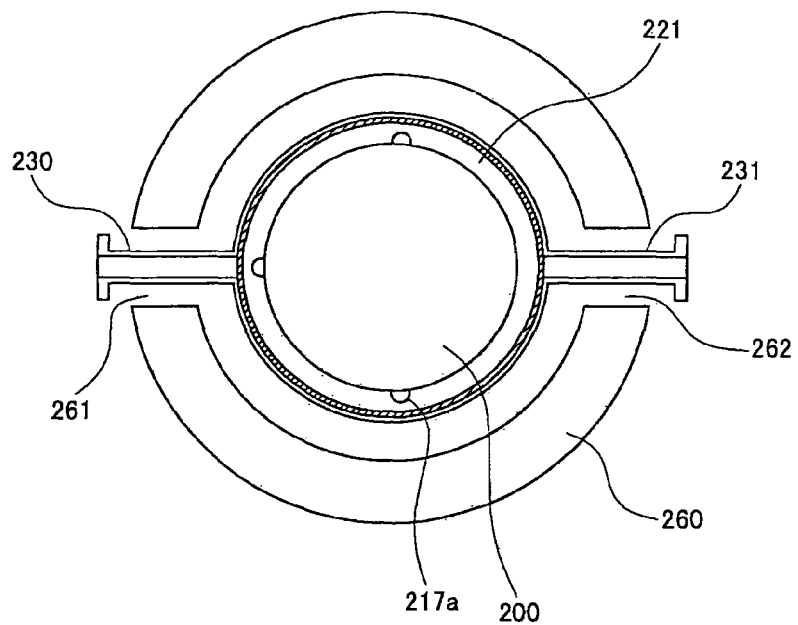
FIG. 24 is a schematic plan view of the vertical-type semiconductor manufacturing apparatus of the second embodiment of the present invention.

FIG. 23 is an expanded view of the main part of this processing furnace 202. FIG. 24 is a lateral cross-sectional view of the processing furnace 202 thereof.

<<Partition Walls>>

Processing partition walls 221 for partitioning the port 217 in plurality in a direction perpendicular to the processing surface of the wafers 200 are provided in the abovementioned port 217. The processing partition walls 221 of the port 217 are, for example, uniformly disposed in a direction perpendicular to the processing surface of the wafers 200. The processing partition walls 221 are formed in a disc shape of diameter equivalent to, for example, the bottom plate 217c and the ceiling plate 217b of the port 217.

More specifically, as shown in FIG. 23, the processing partition walls 221 protrude outward toward the inner wall of the cylindrical reaction tube 203 in a diametric direction from the plurality of supports 217a disposed in a cylindrical shape. Because of these processing partition walls 221, the port 217, or to put this another way, the wafer processing space 204, is partitioned into a plurality of processing partition portions 220 in the perpendicular direction, and gas flows into each of these processing partition portions 220. In the example shown in the diagram, the wafer processing space 204 comprises eight processing partition portions 220a to 220h partitioned by the processing partition walls 221 and, as a result, the flow of film formation gas from a first processing partition portion 220 into a second processing partition portion 220, or from the second processing partition portion 220 into the first processing partition portion 220 can be suppressed. This facilitates a processing of a large number of more uniform wafers 200.

The plurality of wafers 200 are supported in a horizontal state by a plurality of grooves 217d serving as substrate holding portions formed in each of the plurality of supports 217a of the port 217.

Figure 25:
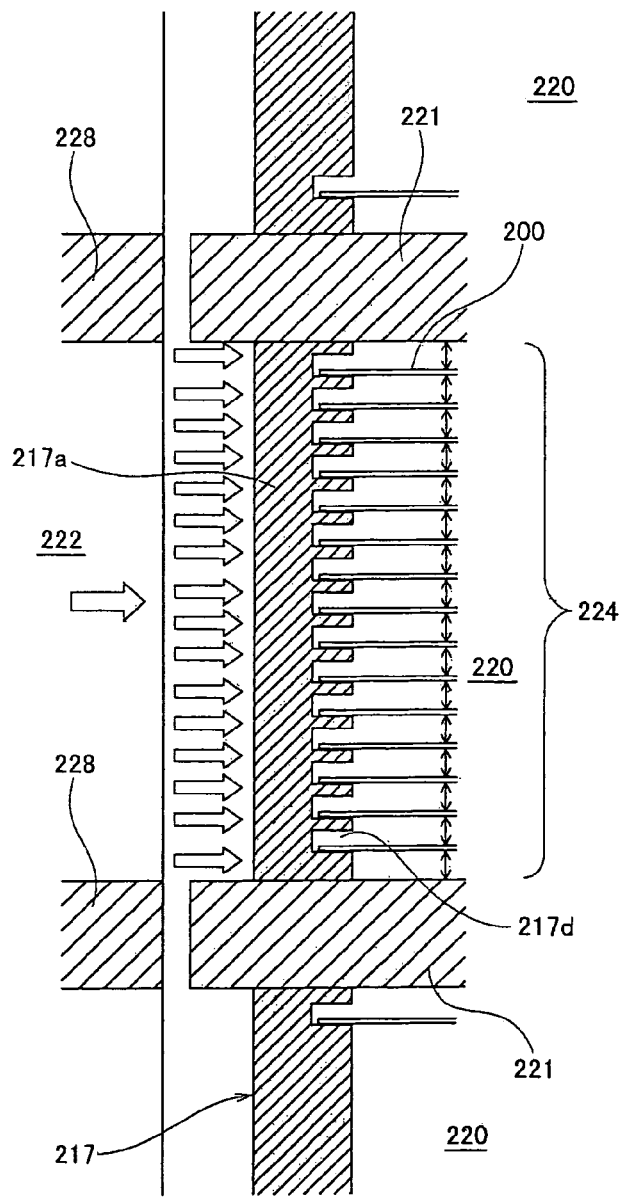
FIG. 25 is a main part expanded view of the vertical-type semiconductor manufacturing apparatus of the second embodiment of the present invention.

For example, as shown in FIG. 25, a plurality of grooves 217d are formed in each of the plurality of supports 217a in such a way that a plurality of wafers 200 are supportable in each of the vertically adjacent processing partition portions 220. To ensure a uniform gap between the plurality of wafers 200, the gap between the plurality of grooves 217d provided in each of the plurality of supports 217a of the vertically adjacent processing partition portions 220 is preferably uniform.

In addition, the plurality of grooves 217d are formed in each of the plurality of supports 217a in such a way that a plurality of wafers 200 are supportable in each of the vertically adjacent processing partition walls 221 in a direction perpendicular to the processing surface of the wafers 200 (the vertical direction in FIG. 25). To ensure a uniform gap across the plurality of wafers 200 supported in the vertically adjacent processing partition walls 221 in a direction perpendicular to the processing surface of the wafers 200 (the vertical direction in FIG. 25), the gap between the plurality of grooves 217d provided in each of the plurality of supports 217a of the vertically adjacent processing partition walls 221 in a direction perpendicular to the processing surface of the wafers 200 (the vertical direction in FIG. 25) is preferably uniform.

The grooves serving as substrate holding portions are not limited to being formed to recess internally from the surface of the supports 217a and may be provided as protruding portions or convex portions formed to protrude from the surface of the supports 217a.

In addition, in order to ensure gas flows into each of the partitions, the respective processing partition walls 221 of the port 217 and gas introduction partition walls 228 corresponding to the processing partition walls 221 are disposed at an equivalent height. In addition, to as far as possible ensure a leak-free flow of gas into the partition portions, the respective processing partition walls 221 and gas introduction partition walls 228 of the port 217 are formed in an equivalent thickness. By the establishment of the processing partition walls 221 and the gas introduction partition walls 228 of the port 217 of equivalent height and equivalent thickness in this way, the gas introduction partition portions are more easily partitioned.

As a result of the respective process gas supply portions 249a to 249h and inert gas supply portions 250a to 250h being disposed in a central section of the gas introduction partition portions 230a to 230h in this way, that is to say, in the middle between the gas introduction partition walls 228, gas can be more reliably supplied to the plurality of wafers 200 between the respective processing partition walls 221.

In addition, in order to ensure the gas can be exhausted from each of the partition portions, the respective processing partition walls 221 of the port 217 and gas exhaust partition walls 229 corresponding to the processing partition walls 221 are disposed at an equivalent height. In addition, to as far as possible ensure the leak-free exhaust of gas from the partition portions, the processing partition walls 221 and gas exhaust partition walls 229 of the port 217 are formed of equivalent thickness.

In addition, the need for all wafers 200 disposed in the perpendicular direction in the partitioned substrate processing region 224 between the processing partition walls 221 to be produced as manufactured wafers is eliminated. For example, the wafers 200 of the uppermost part and lowermost part of the substrate processing region 224 need not be formed as manufactured wafers and may be used as dummy wafers. The provision of dummy wafers ensures uniform manufacture of the wagers of the middle section and eliminates manufactured wafer waste.

<<Effects of the Second Embodiment>>

One or more of the following effects are exhibited by the second embodiment described above.

<<Improved In-plane and Interwafer Processing Uniformity>>

Because processing partition walls 221 that partition the port 217 in plurality are provided in the port 217 in a direction perpendicular to the processing surface of the wafers 200, a film formation gas can flow through the processing partition walls 221 into each of the partitioned processing partition portions 220. In addition, because the flow of an unnecessary gas into and out of the processing partition portions 220 is suppressed by virtue of a first processing partition portion 220 being partitioned from a second processing partition portion 220 by a processing partition wall 221, the appropriate usage gas flow rate in terms of film formation can be obtained. Accordingly, a loading effect can be prevented, and the in-plane and interwafer processing uniformity of the simultaneously processed plurality of wafers 200 is further improved.

In addition, because gas introduction partition walls 228 and gas exhaust partition walls 229 for partitioning the gas inlet tube 230 and the gas exhaust tube 231 into plurality are provided in the gas inlet tube 230 and gas exhaust tube 231 respectively in a direction perpendicular to the processing surface of the wafers 200, the introduction and exhaust of gas in a direction horizontal to the processing partition portions 220 (a side flow) can be established.

That is to say, the gas inlet tube 230 and gas exhaust tube 231 are partitioned into plurality in a direction perpendicular to the processing surface of the wafers 200, and film formation gas flows into these partitioned gas introduction partition portions 230a to 230h. In addition, by virtue of a process gas introduced through each of the plurality of gas introduction partition portions 230a to 230h of the gas inlet tube 230 being exhausted through each of the plurality of gas exhaust partition portions 231a to 231h of the gas exhaust tube 231, a flow of film formation gas in parallel to a plurality of areas in a perpendicular direction of the wafer processing space 204 as shown by the arrows is formed. Because, as a result, a process gas is supplied from the direction horizontal to the wafers 200 and exhausted in a direction horizontal thereto, the process gas can be smoothly supplied across the wafers 200. Accordingly, a loading effect can be prevented, and the in-plane and interwafer processing uniformity of the simultaneously processed plurality of wafers 200 is further improved.

In addition, because the partition walls are provided in a direction perpendicular to the processing surface of the wafers 200, the gas introduced through the gas inlet tube 230 is introduced in a direction parallel to the processing surface of the wafers 200 and, accordingly, flows more readily across the wafers 200. Furthermore, because the gas inlet tube 230 and the gas exhaust tube 231 are disposed on a straight line that passes through the diameter of the wafers 200 disposed in the reaction tube 203, the gas introduction partition portions 230a to 230h that serve as gas entrance regions prior to the gas arriving at the interior of the reaction tube 203 are established in a direction parallel to the processing surface of the wafers 200 and, accordingly, the gas flows even more readily across the wafers 200. Accordingly, a loading effect can be prevented, and the in-plane and interwafer processing uniformity of the simultaneously processed plurality of wafers 200 is further improved.

In addition, because the processing partition walls 221, gas introduction partition walls 228 and gas exhaust partition walls 229 of the port 217 are opposingly provided in the same number and at the same height, the film formation gas can flow uniformly between the processing partition portions. In addition, because the wafers 200 are uniformly disposed in the processing partition portions 220 formed in the port 217, the film formation gas flows uniformly across the wafers 200 in the processing partition portions. Accordingly, a loading effect can be prevented, and the in-plane and interwafer processing uniformity of the simultaneously processed plurality of wafers 200 is further improved.

According to this second embodiment, because processing partition walls 221 are also provided in the port 217, the in-plane and interwafer processing uniformity of the simultaneously processed plurality of wafers 200 is improved. However, for example when there are no processing partition walls 221 provided in the port 217, there is concern that a flow passage 227 will be formed between the reaction tube 203 and the port 217 in a direction perpendicular to the wafer processing surface. For this reason, in addition to a flow of gas in the horizontal direction in the processing chamber 201, a flow of gas in a vertical direction that passes through the flow passage 227 is also formed. That is to say, when there are no processing partition walls 221 provided in the port 217, neither the flow of a film formation gas from a first processing partition portion 220 out to a second processing partition portion 220 or the introduction of a film formation gas from the second processing partition portion 220 to the first processing partition portion 220 within the processing chamber 201 can be suppressed. This creates differences in the flow rate of the film formation gas between processing partition portions 220 and affects the in-plane wafer uniformity in the processing partitions and the interwafer thickness uniformity in the processing partition portions. These problems are resolved by the embodiment described above.

In addition, according to the second embodiment, because the gas inlet tube is provided in the side of the reaction tube in order to establish the gas flow as a side flow, the maintenance characteristics are markedly better than when a gas nozzle is provided. In addition, because the gas inlet tube is provided on the outside of the wafer processing space, there is much reduced attachment and accumulation of reaction product compared to when the gas inlet tube is provided in the wafer processing space. In addition, according to the second embodiment, because selective introduction of either a process gas or an inert gas through the partitions of the gas inlet tube is possible, altered film formation conditions can be accommodated without need to alter the gas inlet tube, and there are no limitations to the conditions in which a film is formable. Accordingly, by simply carrying out a desired maintenance or replacement of the gas inlet tube, the in-plane and inter substrate processing uniformity of a simultaneously processed plurality of substrates is improved.

<<Second Embodiment Modifications>>

The following range of modifications can be made to the second embodiment of the present invention described above.

<<Processing Partition Wall Shape, Arrangement and Number>>

While the embodiment described above describes an example in which the processing partition walls provided in the port describe a disc shape and are formed in a certain arrangement and number in the port, the shape, arrangement and number of these processing partition walls is not limited thereto.

<<Assembled Port>>

In addition, while the port 21 of the embodiment described above is integrated, an assembled body that is disassemblable into processing partition units may be adopted. For example, a port 217 formed as a laminate of port constituent elements may be adopted. The assembly of this port is based on a plurality of port constituent elements being disposed in an arrangement in which one port constituent element is placed on another port constituent element in sequence.

Figure 26:
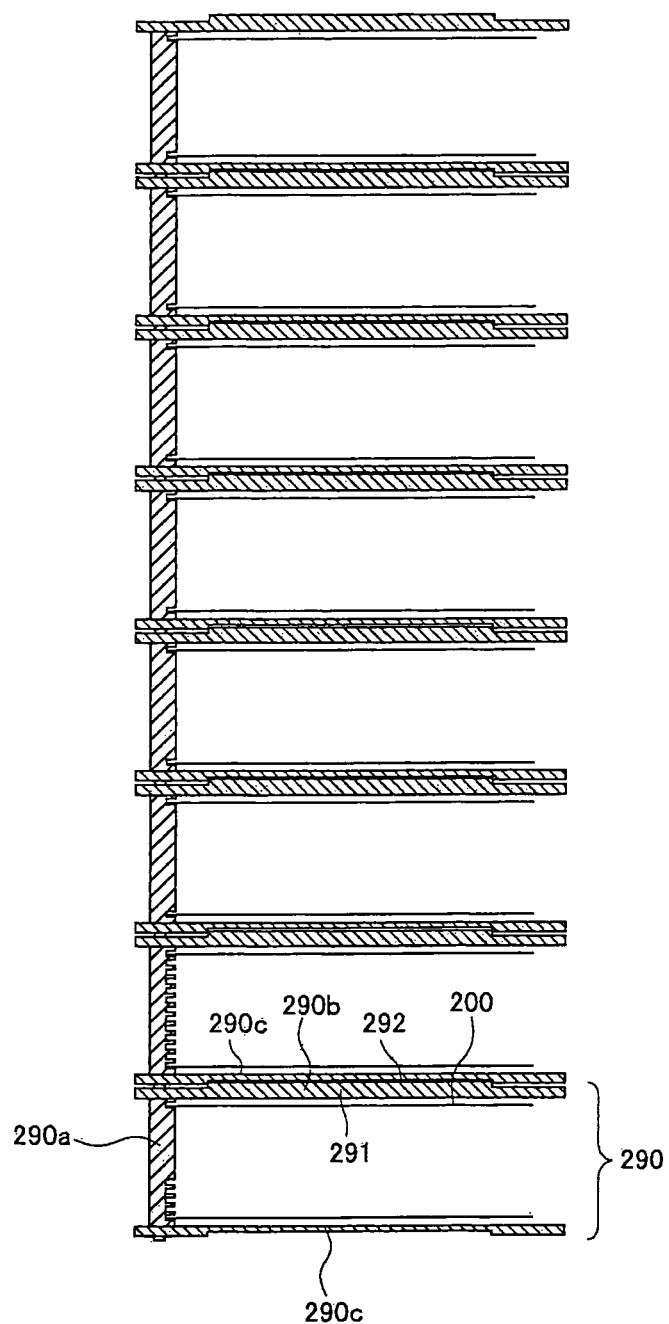
FIG. 26 is a schematic side view of a port of a first modification of the second embodiment.

For example, as in a first modification shown in FIG. 26, the basic configuration of the port 217 is the same as that of the previously described configuration. The port 217 is constituted from port constituent element 290 of equivalent shape that divide the port 217 in plurality in the height direction thereof. The port constituent elements comprise a plurality of short supports 290a arranged in a cylindrical shape to support the outer circumferential portion of the wafers 200, a cylindrical ceiling plate 290b for closing the upper part between the plurality of short supports 290a, and a disc-shaped bottom plate 290c for closing the lower part between the plurality of short supports 290a. A plurality of grooves serving as substrate holding portions that support the outer circumferential portion of the wafers 200 are cut into the side of the plurality of short supports 290a.

A protruding engaging portion 291 is provided in the ceiling plate 290b and a recessed engaged portion 292 is provided in the bottom plate 290c so that when a second port constituent element is placed on a first port constituent element 290 the ceiling plate 290b of the first port constituent element 290 and the bottom plate 290c of the second port constituent element engage. The engaged portion 292 may be provided in the ceiling plate 290b and the engaging portion 291 provided in the bottom plate 290c. In addition, in order for the short supports 290a of the port constituent element 290 to be sequentially linked, a fit-insertion mode in which a drill hole is provided in the upper part of the short supports 290a and a protruding portion that fits into the drill hole and that protrudes from the lower face of the bottom plate 290c is provided in the lower part of the short supports 290a is established between the upper part of the short supports 290a of a first port constituent element and the lower part of the short supports 290a of a second port constituent element. The protruding portion may be provided in the upper part of the short supports 290a and the drill hole provided in the lower part of the short supports 290a.

Processing partition walls are constituted from the ceiling plate 290b and bottom plate 290c described above. This sequentially placing of one port constituent element 290 on another port constituent element 290 affords the assembly of a port of a laminated structure. The processing partition walls of the center portion of the port excluding the bottom plate 290c and ceiling plate 290b of the assembled port form a double-layer structure comprising the ceiling plate 290b of one port constituent element 290 and the bottom plate 290c of another port constituent element 290 placed thereon.

By virtue of the port being configured from a plurality of port constituent elements 290 and the port constituent elements 290 being laminated in this way, the port can also be partitioned by the ceiling plate 290b and the bottom plate 290c that serve as boundaries between the port constituent elements 290. According to this embodiment, the laminated number of port constituent elements can be easily altered in accordance with the number of wafers to be processed.

<<Gas Discharge Pipe>>

Figure 27:
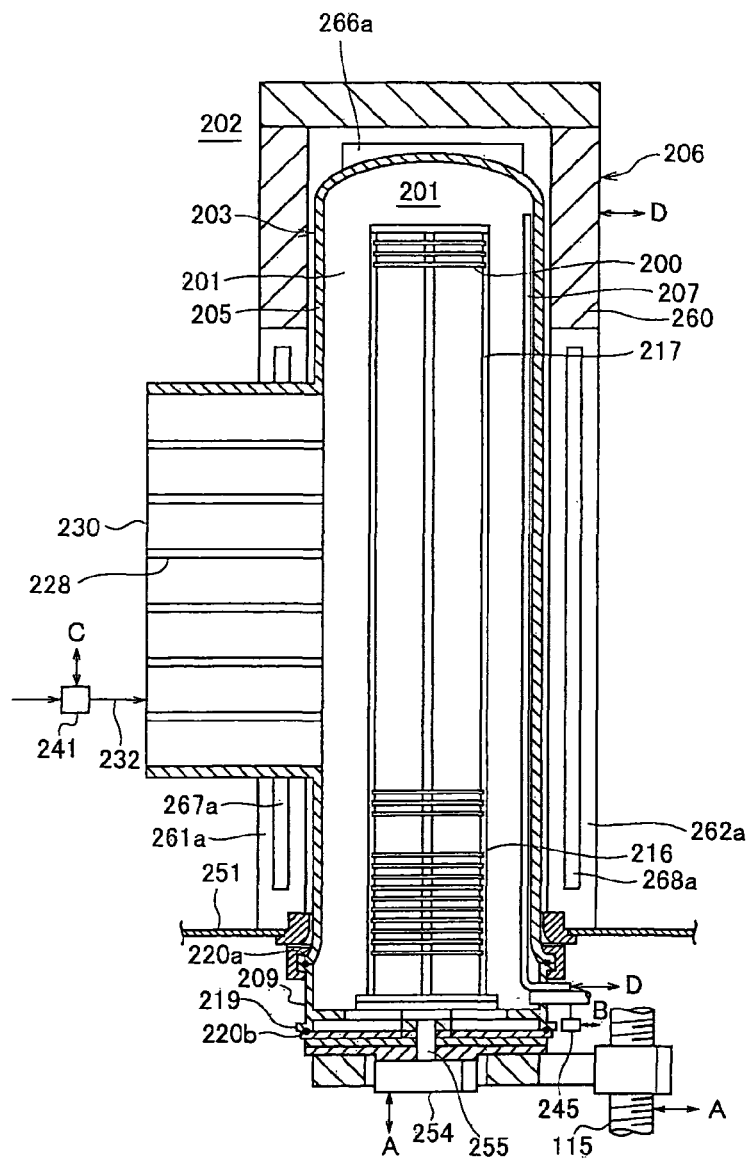
FIG. 27 is a main part expanded view of a vertical-type semiconductor manufacturing apparatus of a second modification of the second embodiment.

In addition, while the embodiment described above describes the provision of not only a gas inlet tube but also a gas exhaust tube in the side of the reaction tube along the substrate processing region thereof, the present invention is not limited thereto. Even though the in-plane and interwafer uniformity is somewhat worse than when the gas exhaust tube is provided in the side of the reaction tube along the substrate processing region thereof, when the reaction vessel is configured from a reaction tube 203 and a manifold 209, the gas inlet tube 230 may be provided in the side of the reaction tube 203 and the gas exhaust tube 231 provided in the manifold 209 as in, for example, the second modification shown in FIG. 27. In this case it is preferable that gas introduction partition walls 228 that partition the gas inlet tube 230 in plurality are provided in the side of the reaction tube 203 in a direction perpendicular to the processing surface of the wafers 200. This modification is applicable to the first to third embodiments.

<<Processing Partition Walls>>

In addition, while in the embodiment described above the processing partition walls 221 provided in the port 217 are formed in a disc shape of diameter equivalent to the bottom plate 217c and ceiling plate 217b of the port 217, this is not limited thereto. The processing partition walls should be at least the size of the wafers, and more preferably should be formed larger than the outer circumferential side of the supports in such a way as to enclose the port supports. In this case, instead of the diameter of the processing partition walls of the port being increased in size, the partition walls of the gas inlet tube 230 and/or gas exhaust tube 231 may protrude therefrom.

Figure 28:
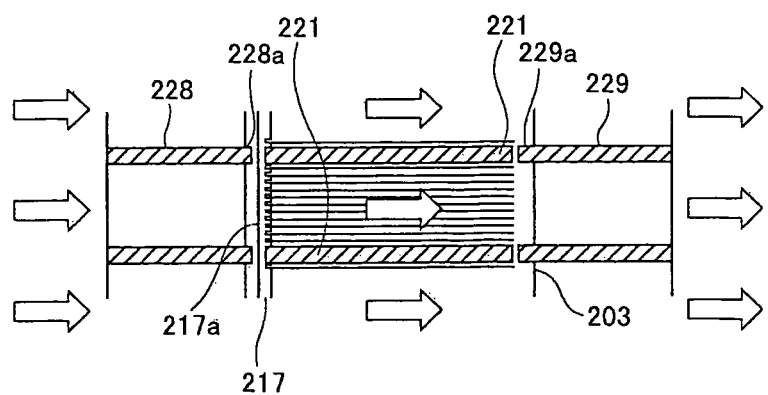
FIG. 28 is a main part expanded view of the vertical-type semiconductor manufacturing apparatus of a third modification of the second embodiment.

FIG. 28 shows a third modification in which the partition walls of the gas inlet tube 230 and/or gas exhaust tube 231 protrude in this way.

Apart from the processing partition walls 221 and gas introduction partition walls 228 of the port being disposed at an equivalent height, the gas introduction partition walls 228 comprise protruding portions 228a that protrudes inward from the inner wall surface of the reaction tube 203. In addition, apart from the processing partition walls 221 and gas exhaust partition walls 229 of the port 217 being disposed at an equivalent height, the gas exhaust partition walls 229 comprises protrusions 229a that protrudes outward in the diametric direction from the inner wall surface of the reaction tube 203.

While the processing partition walls 221 provided in the port 217 may be formed to extend from the outer circumferential side of the plurality of supports 217a to the exterior, provision in the gas introduction partition walls 228 and/or gas exhaust partition walls 229 of protrusions 228a, 229a that protrude in the diametric direction from the inner wall surface of the reaction tube 203 affords a reaction tube of a simplified structure.

Figure 29:
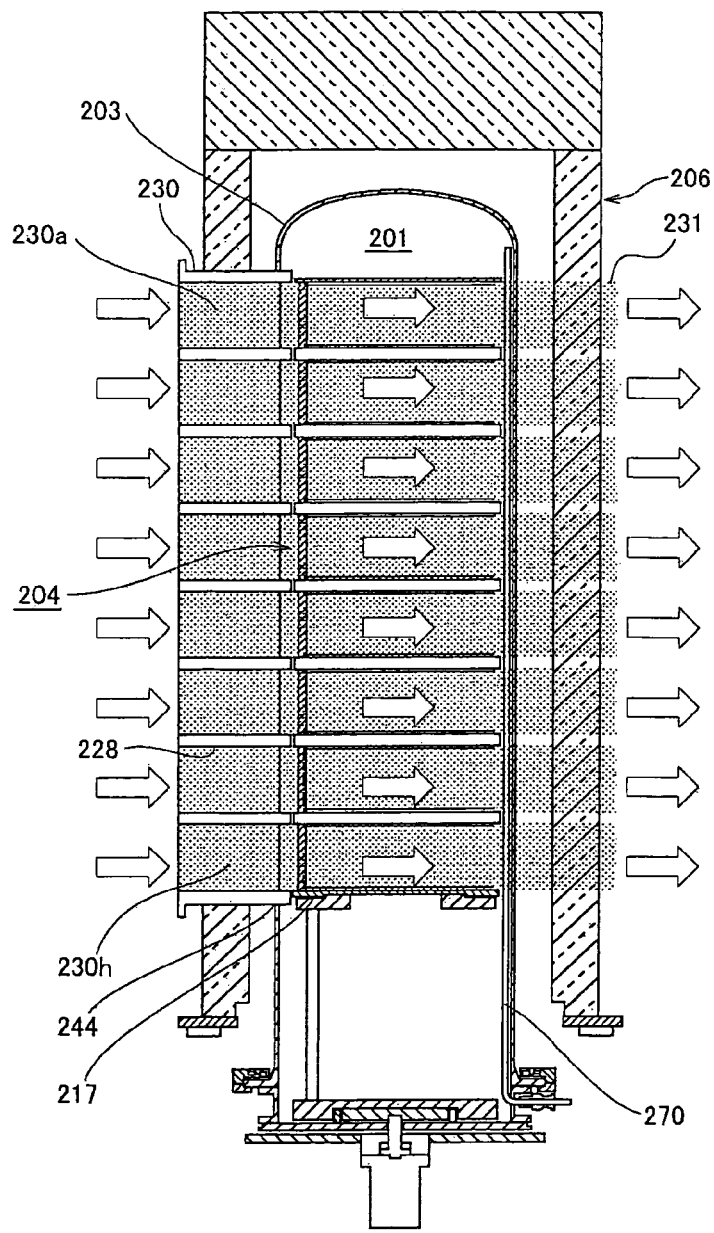
FIG. 29 is a schematic side view of a vertical-type semiconductor manufacturing apparatus of a third embodiment of the present invention.
Figure 30:
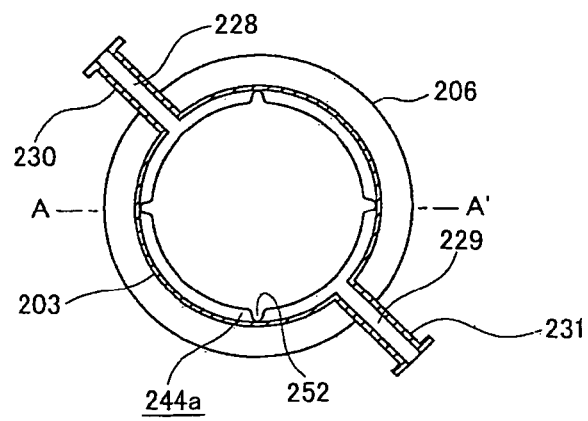
FIG. 30 is a lateral cross-sectional view of a processing furnace prior to a temperature detector being housed therein of the third embodiment of the present invention.
Figure 31:
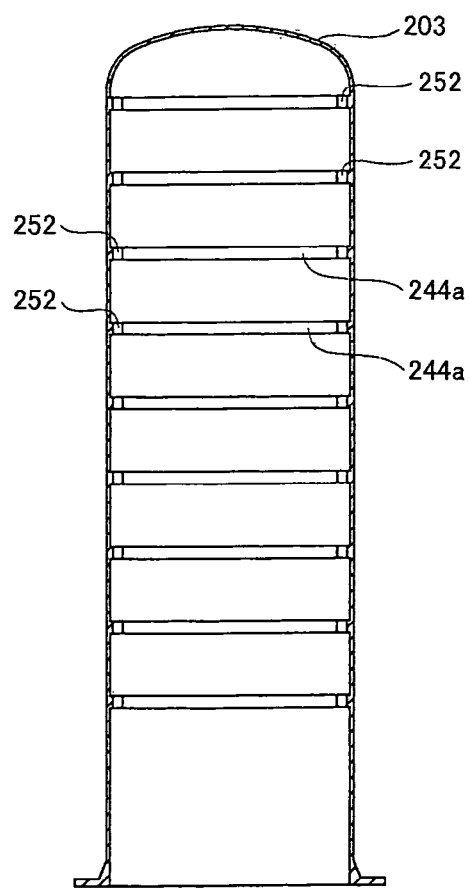
FIG. 31 is a longitudinal cross-sectional view along the line A-A' of FIG. 30.
Figure 32:
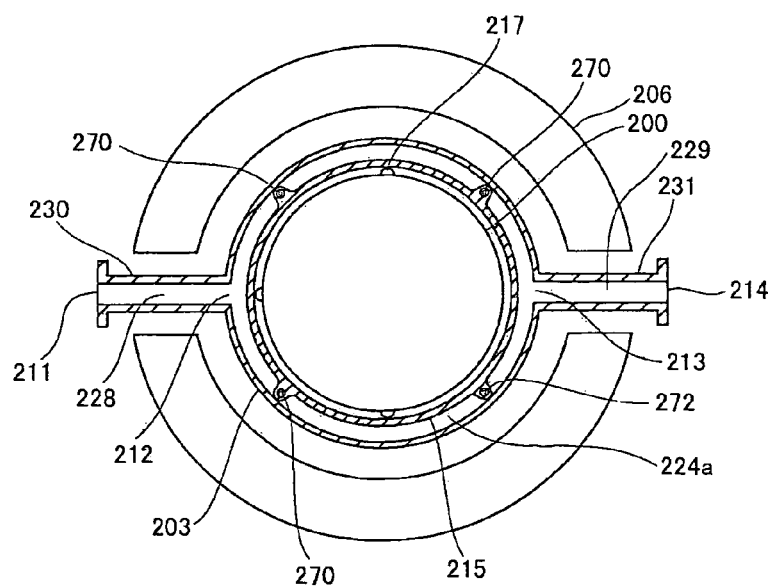
FIG. 32 is a lateral cross-sectional view of a processing furnace subsequent to a temperature detector being housed therein of the third embodiment of the present invention.

A third embodiment of the substrate processing apparatus of the present invention will be hereinafter described with reference to FIG. 29. The processing furnace shown in FIG. 29 describes a separate mode of processing furnace to the processing furnace shown in FIG. 22. The basic configuration of the processing furnaces is the same, and the constituent elements of this processing furnace correspond to those of the processing furnace of the second embodiment described earlier with reference to FIG. 22. The processing furnace shown in FIG. 29 differs from the processing furnace shown in FIG. 22 in the point whereby a temperature sensor 270 serving as a temperature detector is housed in a protruding portion 244 provided in the gas inlet tube 230 and gas exhaust tube 231. FIG. 30 is a lateral cross-sectional view of the processing furnace prior to the temperature sensor being housed therein, FIG. 31 is a vertical cross sectional view along the line A-A' of FIG. 30, and FIG. 32 is a horizontal cross-sectional view of the processing furnace subsequent to the temperature sensor being housed therein.

The temperature sensor 270 serving as a temperature detector for measuring the temperature of the wafer processing space 204 is arranged in the reaction tube 203 of this processing furnace. The temperature sensor extends in the direction perpendicular to the wafer processing surface of the wafers 200 which are disposed in plurality. A temperature control unit (see symbol 238 of FIG. 17) is electrically connected to the temperature sensor 270. The temperature control unit is configured to control zones of the heater 206 zonally divided in the longitudinal direction. The temperature control unit is configured to execute control at a desired timing based on the current load to the heater 206 being adjusted in accordance with temperature information detected by the temperature sensor 270 to establish the desired temperature of the temperature of the wafer processing space 204.

In addition, a protruding portion 244 that protrudes inward in the diametric direction from the inner wall surface of the reaction tube 203 is provided in at least the upper end and lower end of the gas inlet tube 230 and gas exhaust tube 231. In the example illustrated in FIG. 30 and FIG. 31, this protruding portion 244 is configured from a ring 244a integrally provided along the inner wall surface of the reaction tube 203. This ring 244a is provided not only in the upper end and lower end of the gas inlet tube 230 and gas exhaust tube 231 but also the center portion thereof. These rings 244a are disposed in such a way as to link the gas introduction partition walls 228 of the gas introduction partition portions including the upper end and lower end of the gas inlet tube 230 and the gas exhaust partition walls 229 of the gas exhaust partition portions including the upper end and lower end of the gas exhaust tube 231 correspondent thereto in the horizontal direction in the same plane.

In addition, a plurality of notched portions 252 for housing temperature sensors 270 for detecting the temperature of the processing chamber 201 are provided in an equivalent position in the circumferential direction in the rings 244a in a direction perpendicular to the processing surface of the wafers. In such a way as to ensure the temperature sensors housed in the notched portions 252 do not obstruct the gas flow, the plurality of notched portions 252 are provided in a plurality of areas excluding positions along a center line between the gas inlet tube 230 and gas exhaust tube 231.

As shown in FIG. 32, the plurality of temperature sensors 270 are housed in the notched portions 252 in an equivalent position in the perpendicular direction in the plurality of rings 244a provided in the vertical direction.

In the processing furnace pertaining to the third embodiment described above, rings 244a that protrude inward from the inner side wall of the reaction tube 203 are provided in partition portions, these rings 244a being uniformly disposed in the perpendicular direction of the reaction tube 203. Accordingly, gas introduced through the gas spouting ports 212 into the reaction tube 203 flows uniformly to the wafers 200. In addition, because the rings 244a protrude inward of the reaction tube 203 to occupy a portion of an unnecessary flow space 215 between the wafers 200 and the reaction tube 203, this unnecessary flow space 215 is reduced and unnecessary gas flow into and out of the partitions is suppressed by the rings 244a. Accordingly, an introduced gas flow rate of appropriate flow rate for film formation is established.

Furthermore, because the rings 244a comprise the notched portions 252 and the temperature sensors 270 are housable in these notched portions 252, tilt and positional displacement of the temperature sensors 270 can be prevented, and the reproducibility of the position in which the temperature sensor is arranged is improved. Accordingly, the temperature can be accurately detected by the temperature sensors 270.

The gas spouting ports 212 for spouting gas from the gas inlet tube 230 into the processing chamber 201 of the embodiment described above are provided in a slit form. The slit is provided so as to straddle at least of plurality of wafers 200 in the perpendicular direction to the wafer processing surface. It is clear that the gas flow conditions and the gas temperature distribution and so on are altered by the ratio of the length, width and breadth of the gas spouting port 212 and the ratio of the width of the gas spouting port 212 to the length of the gas inlet tube 230. Accordingly, the optimum slit formed gas spouting port 212 mode is preferably able to be specified. Thereupon, a simulation of gas flow within a reaction tube using the shape of the gas spouting port 212 as a parameter was conducted with a view to specifying the optimum slit formed gas spouting port 212 mode.

Figure 33:
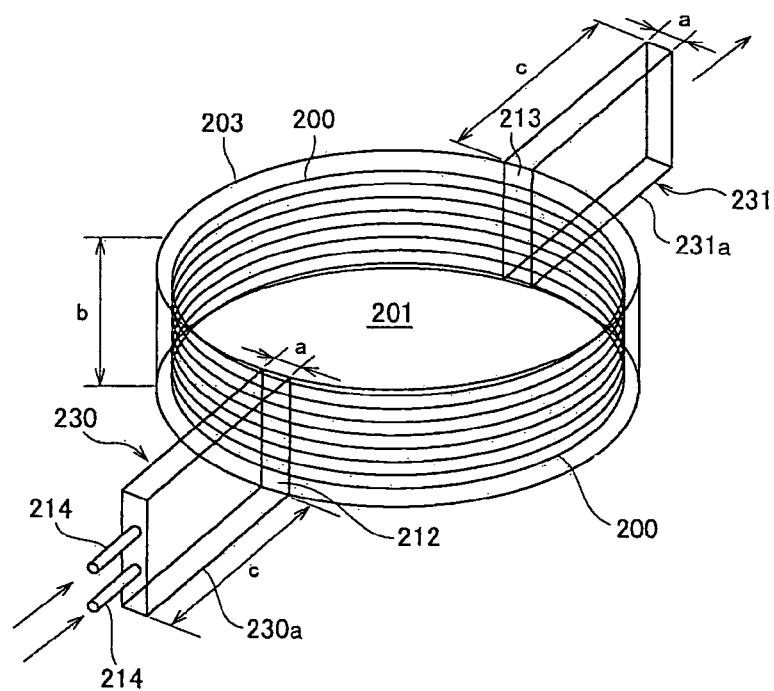
FIG. 33 is a simulation model diagram of gas flow velocity using the slit formed gas spouting port of the embodiments of the present invention.
Figure 34:
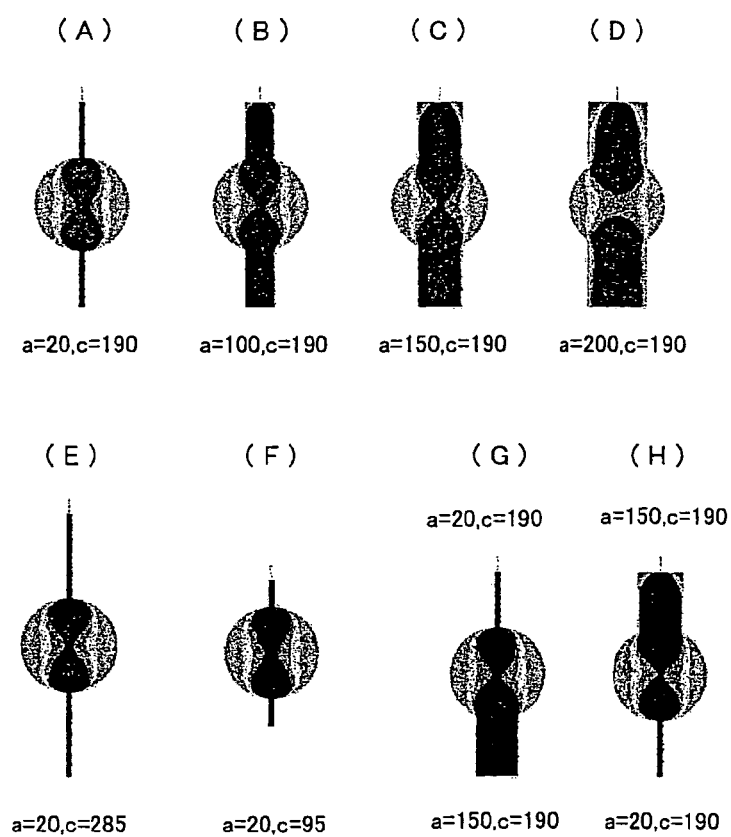
FIG. 34 is an explanatory diagram of the simulation results for a 300 mm wafer using the slit formed gas spouting port of the embodiments of the present invention.
Figure 35:
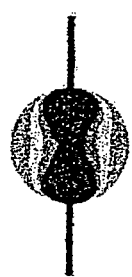
FIG. 35 is an explanatory diagram of the simulation results for a 450 mm wafer using the slit formed gas spouting port of the embodiments of the present invention.
Figure 35:
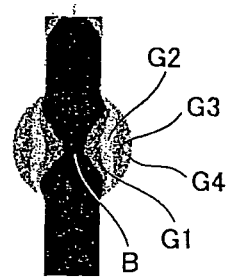

FIG. 33 is a simulation model diagram, and FIGS. 34 and 35 are explanatory diagrams of the simulation results thereof.

The model shown in FIG. 33 constitutes a reaction tube model based on extraction of a single gas introduction partition (for example 230a) and gas exhaust partition (for example 231a) alone from the gas inlet tube 230 and gas exhaust tube 231. A slit formed gas spouting port 212 and gas exhaust port 213 are disposed in the gas introduction partition portion 230a and gas exhaust partition portion 231a so as to straddle eight wafers 200. Two gas inlet tubes 214 are connected to the gas introduction partition portion 230a. The distance between the wafers 200 and the inner wall of the reaction tube 203 is 5 mm, and the height of the side of the reaction tube 203 in which the gas introduction partition portion 230a and gas exhaust partition portion 231a are provided is fixed to a height b=90 mm. Dimensions a and c are used as parameters. Dimension a denotes either the inner lateral width of the gas inlet tube 230 or the gas exhaust tube 231, or the lateral width of the gas spouting port 212 or lateral width of the gas exhaust port 213, while the dimension c denotes the length of the gas inlet tube 230.

FIG. 34 and FIG. 35 are side cross-sectional views of the gas flow velocity results taken at the center portion in the vertical direction (height 45 mm from bottom) of the reaction tube 203. The gas flow velocity is displayed using a Dithering method. As illustrated in FIG. 35 serving as an example thereof, of the plurality of zones indicated by this Dithering method, the nearer the zone to the darker zone B the faster the gas flow velocity, the grey colored zones G1, G2, G3, G4 of different shades indicating a slowing of gas flow velocity toward the wall of the reaction tube (B>G1>G2>G3>G4). The gas flow velocity is scalar displayed.

FIG. 34 is a diagram of simulation results obtained for processing a 300 mm diameter wafer. The gas flow rate supplied from each of two pipes was 0.5 L/min, and the gas pressure of the gas exhausted through the gas exhaust tubes was 30 Pa.

In FIG. 34A, a length of both the gas inlet tube and the gas exhaust tube of 190 mm, and an inner width of the gas inlet tube and gas exhaust tube and a width of the gas spouting port and gas exhaust port of 20 mm was adopted with respect to the 300 mm wafer. In other words, the width of the gas spouting port and the gas exhaust port was 1/15 the wafer diameter.

In this mode, the dark-colored section corresponds to the gas inlet tube, the gas exhaust tube and the wafer center. In other words, the gas spouted from the gas spouting port passes across the wafer center and arrives at the gas exhaust tube at a flow velocity equivalent to the flow velocity at which it flows through the gas inlet tube.

That is to say, taking the inner width of the gas inlet tube and the gas exhaust tube and a width of the gas spouting port and gas exhaust port as being 1/15 the wafer diameter, the gas flow is more readily able to be generated as a laminar flow in one direction, and the amount of gas passing across the wafers can be made uniform. Accordingly, a gas of uniform density and velocity can be fed across the wafers, and the wafer in-plane interwafer film thickness uniformity improved. In addition, the gas can be supplied from the upstream tip-end portion of the gas inlet tube to the wafer without a drop in the gas flow velocity occurring.

In FIG. 34B, a length of both the gas inlet tube and the gas exhaust tube of 190 mm, and an inner width of the gas inlet tube and gas exhaust tube and a width of the gas spouting port and gas exhaust port of 100 mm was adopted with respect to the 300 mm wafer. In other words, the width of the gas spouting port and the gas exhaust port was 1/3 the wafer diameter.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 34C, a length of both the gas inlet tube and the gas exhaust tube of 190 mm, and an inner width of the gas inlet tube and gas exhaust tube and a width of the gas spouting port and gas exhaust port of 150 mm was adopted with respect to the 300 mm wafer. In other words, the width of the gas spouting port and the gas exhaust port was 1/2 the wafer diameter.

In this mode as well, similarly to FIGS. 34A and 34B, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 34D, a length of both the gas inlet tube and the gas exhaust tube is 190 mm, and an inner width of the gas inlet tube and gas exhaust tube and a width of the gas spouting port and gas exhaust port of 200 mm was adopted with respect to the 300 mm wafer. In other words, the width of the gas spouting port and gas exhaust port was ⅔ the wafer diameter.

In this mode, the dark-colored section does not correspond with the wafer center. In other words, the gas spouted from the gas spouting port passes across the wafer center at a lower flow velocity to the flow velocity at which it flows in the gas inlet tube. For this reason, compared to FIGS. 34A to 34C described above, the desired film thickness uniformity is much more difficult to ensure.

In FIG. 34E, a length of both the gas inlet tube and the gas exhaust tube of 285 mm, and an inner width of the gas inlet tube and gas exhaust tube and a width of the gas spouting port and gas exhaust port of 20 mm was adopted with respect to the 300 mm wafer.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 34F, a length of both the gas inlet tube and the gas exhaust tube of 95 mm, and an inner width of the gas inlet tube and gas exhaust tube and a width of the gas spouting port and gas exhaust port of 20 mm with respect to the 300 mm wafer was adopted.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 34G, a length of both the gas inlet tube and the gas exhaust tube of 190 mm, and an inner width of the gas inlet tube and width of the gas introduction orifice of 150 mm with respect to the 300 mm wafer was adopted. In addition, an inner width of the gas exhaust tube and the gas exhaust port of 20 mm was adopted.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 34H, a length of both the gas inlet tube and the gas exhaust tube of 190 mm, and an inner width of the gas inlet tube and gas introduction orifice of 20 mm with respect to the 300 mm wafer was adopted. In addition, an inner width of the gas exhaust tube and width of the gas exhaust port of 150 mm was adopted.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

FIG. 35 is a diagram of simulation results obtained for processing a 450 mm diameter wafer. The gas flow rate from the pipes was set at 1.125 L/min or approximately 2.25 times the gas flow rate employed for processing the 300 mm wafer, and the gas pressure of the gas exhausted from the gas exhaust tube was set to a pressure equivalent to the pressure employed for processing the 300 mm wafer of 30 Pa.

In FIG. 35A, a length of both the gas inlet tube and the gas exhaust tube of 285 mm, and an inner width of the gas inlet tube and gas exhaust tube and width of the gas spouting port and gas exhaust port of 30 mm with respect to the 450 mm wafer was adopted. In other words, the width of the gas spouting port and the gas exhaust port was ¹⁄₁₅ the wafer diameter.

In this mode, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

In FIG. 35B, a length of both the gas inlet tube and the gas exhaust tube of 285 mm, and an inner width of the gas inlet tube and gas exhaust tube and a width of the gas spouting port and gas exhaust port of 225 mm with respect to the 450 mm wafer was adopted. In other words, the width of the gas spouting port and gas exhaust port was set to ½ the wafer diameter.

In this mode as well, similarly to FIG. 34A, and even though the range of the dark zone region is less than in FIG. 34A, the dark-colored section corresponds to the gas inlet tube, the gas exhaust tube and the wafer center. In other words, the gas spouted from the gas spouting port passes across the wafer center and reaches the gas exhaust tube at a flow velocity equivalent to the flow velocity at which it flows through the gas inlet tube.

Here, it is preferable that the minimum size at which a gas pipe can be connected of 6.35 mm be adopted as the minimum width of the gas inlet tube.

The following can be inferred from the simulation results described above.

The lateral width a of the gas spouting port is preferably less than the wafer diameter. If this is the case, the gas can be supplied from the upstream side tip-end portion of the gas inlet tube to the wafer without a drop in gas flow velocity occurring.

Taking the lateral width of the gas spouting port as a and the height thereof as b, it is preferable that $a<b$. Assuming $a<b$, gas can be supplied from the upstream tip-end portion of the gas inlet tube to the wafer without a drop in gas flow velocity occurring. In addition, assuming a change in the height b of the gas spouting port for processing a plurality of wafers, it is preferable from the viewpoint of pressure resistance that the width a thereof is reduced.

Taking the lateral width of the gas spouting port as a and the length of the gas spouting port as c, it is preferable that $a<c$. Attempts to impart as large an amount of heat as possible in the pre-heating range under fixed heater (heating device) temperature, gas pressure and gas flow rate conditions necessitate an increase in the length c in the direction in which the gas advances with respect to the heating source, and the width a should be reduced by that amount.

It is preferable that the lateral width of the gas spouting port and/or gas exhaust port is no more than ½ the wafer diameter, and more preferably that the lateral width of the gas spouting port and/or gas exhaust port is no more than $1/3$ the wafer diameter, and even more preferably that the lateral width of the gas spouting port and/or gas exhaust port is no more than $1/15$ the wafer diameter.

Preferred modes of the present invention will be hereinafter described.

A first mode of the substrate processing apparatus provides a substrate processing apparatus comprising: a reaction tube having in an interior thereof a processing chamber in which a plurality of substrates disposed in a direction perpendicular to a substrate processing surface can be processed; and a heating device provided to surround an outer circumference of the reaction tube, a gas inlet tube being provided on a side face of the abovementioned reaction tube in a region for processing a substrate inside the abovementioned reaction tube, so as to reach at least an outside of the abovementioned heating device, and a gas spouting port being disposed in this gas inlet tube in a slit form so as to straddle at least a plurality of the substrates in a direction perpendicular to the abovementioned substrate processing surface, for spouting gas from the abovementioned gas inlet tube into the abovementioned processing chamber.

Because a gas inlet tube is disposed on a side face of the abovementioned reaction tube in a region for processing a substrate inside the abovementioned reaction tube, the gas flow supplied from the gas inlet tube into the reaction tube forms a side flow and, as a result, the substrate processing efficiency is improved.

Because a gas spouting port being disposed in this gas inlet tube in a slit form so as to straddle at least a plurality of the substrates in a direction perpendicular to the abovementioned substrate processing surface for spouting gas from the abovementioned gas inlet tube into the abovementioned processing chamber, the amount of gas flowing across the substrates is improved, and the in-plane and intersubstrate film thickness uniformity improved.

It is preferable in this first mode that the abovementioned gas inlet tube comprise a plurality of gas introduction partition portions partitioned in a direction perpendicular to the processing surface of the abovementioned substrates, and that the abovementioned gas spouting port be formed in each of the abovementioned gas introduction partition portions.

When the gas inlet tube comprises a plurality of gas introduction partition portions partitioned in a direction perpendicular to the processing surface of the abovementioned substrates and the abovementioned gas spouting port is formed in each of the gas introduction partition portions, a reliable and uniform flow of gas across the substrates is produced, and a loading effect can be prevented. In addition, because an unnecessary gas flow into and out of the partitions is suppressed, the proper usage gas flow rate for processing can be obtained. Accordingly, the in-plane and intersubstrate film thickness uniformity of a large number of substrates on which a film is being simultaneously formed is improved.

In addition, the abovementioned gas spouting port is preferably formed one for each of the abovementioned gas introduction partition portions. Because a single introduction flow rate can be spouted from a single gas spouting port by formation of a single gas spouting port in each of the gas introduction partition portions in this way, gas of a state having equivalent heat quantity and in which there is no drop in gas flow velocity at the center portion of the substrates arrives at the center of the substrates.

In addition, the opening area of the abovementioned gas introduction orifice is preferably equivalent to the cross-sectional area of the abovementioned gas introduction partition portion in a direction perpendicular to the abovementioned substrate processing surface. When the opening area of the gas introduction orifice is equivalent to the cross-sectional area of the gas introduction partition portion in a direction perpendicular to the substrate processing surface, gas can be supplied more smoothly to the substrate processing surface.

In addition, in this first mode the abovementioned gas inlet tube is preferably formed so that a distance from at least the abovementioned gas spouting port to an upstream tip-end portion of the gas inlet tube is greater than a distance between two ends of the abovementioned gas spouting port in a circumferential direction of the substrates.

In addition, in a configuration such as this when the gas introduction portion is provided lengthways along the side of the reaction tube, gas can be supplied to the substrate processing surface without drop in gas flow velocity from the upstream tip-end portion of the gas inlet tube to the substrates.

In addition, in this first mode the abovementioned gas inlet tube is preferably formed along an entire side along the abovementioned substrate processing region. When the gas inlet tube is formed along an entire side along the substrate processing region, the substrate processing region is covered by a side flow.

In addition, in this first mode it is preferable that a gas exhaust tube is further provided on the side face of the reaction tube in a region for processing a substrate inside the abovementioned reaction tube so as to reach at least an outside of the heating device, and that a gas exhaust port disposed is provided in the gas exhaust tube in a slit form so as to straddle at least a plurality of the substrates in a direction perpendicular to the abovementioned substrate processing surface for exhausting gas into the abovementioned gas exhaust tube from the abovementioned processing chamber.

Because both a gas introduction and a gas exhaust side flow are formed, when a gas exhaust tube is disposed on the side face of the reaction tube and the gas exhaust port is provided in a slit form in this gas exhaust tube in a direction perpendicular to the substrate processing surface so as to straddle at least a plurality of substrates, for exhausting gas into the gas inlet tube from the processing chamber, the substrate processing efficiency can be further improved. In addition, the amount of gas flowing across the substrates can be made uniform, and the in-plane and intersubstrate film thickness uniformity further improved.

It is preferable that the abovementioned gas inlet tube comprise a plurality of gas introduction partition portions partitioned in a direction perpendicular to the processing surface of the abovementioned substrates, and that the abovementioned gas spouting port be formed in each of the abovementioned gas introduction partition portions.

Apart from the gas inlet tube, when the gas exhaust tube comprises gas exhaust partition portions and a gas spouting port is formed in each of the gas exhaust partition portions, a reliable and uniform flow of gas across the substrates is produced, and a loading effect can be prevented. In addition, because an unnecessary gas flow into and out of the partitions is suppressed, the proper usage gas flow rate for processing can be obtained. Accordingly, the in-plane and intersubstrate film thickness uniformity of a large number of substrates on which a film is being simultaneously formed is improved.

It is preferable that a process gas supply portion and a first inert gas supply portion are connected to an upstream side of the abovementioned gas introduction partition portions, and that a gas supply portion is further provided for, when processing the substrates in the abovementioned reaction tube, supplying a process gas from the process gas supply portion when the substrates are disposed in positions opposing the gas introduction partition portions, and supplying an inert gas from the inert gas supply portion when no substrate is disposed in positions opposing the gas introduction partition portions.

Because an inert gas rather than a process gas is supplied by means of a gas control unit from the gas introduction partition portions of the position in which there are no substrates disposed, that attachment and accumulation of reaction product in the reaction tube can be suppressed.

In addition, the first mode is preferably further provided with a plasma generating device constituted from electrodes disposed outside the processing chamber, with the abovementioned gas inlet tube between these electrodes, for creating plasma of a gas in the abovementioned gas inlet tube.

Because a remote plasma system can be established when a plasma generating device constituted from electrodes disposed externally of a processing chamber about the abovementioned gas inlet tube for creating a plasma of a gas of the abovementioned gas inlet tube is further provided, damage to the substrates can be avoided, and the in-plane and intersubstrate film thickness uniformity of a plurality of substrates on which a film is simultaneously formed is improved.

In addition, the first mode preferably further comprises a second inert gas supply portion for supplying an inert gas from above the abovementioned reaction tube into the reaction tube.

When a second inert gas supply portion for supplying an inert gas from above the reaction tube into the reaction tube is provided, the flow of process gas above the reaction tube can be prevented.

In addition, the first mode preferably further comprises a third inert gas supply portion for supplying an inert gas from below the abovementioned reaction tube into the reaction tube. When a third inert gas supply portion for supplying an inert gas from below the reaction tube into the reaction tube is provided, the flow of process gas below the reaction tube can be prevented.

In addition, the first mode preferably further comprises a gas interrupting portion above the abovementioned reaction tube. When a gas interrupting portion is provided above the reaction tube, the flow of process gas above the reaction tube can be prevented.

In addition, it is preferable that a reinforcing member for reinforcing the wall of the reaction tube and which extends in a direction perpendicular to the processing surface of the abovementioned substrates is further provided in the abovementioned gas interrupting portion. When a reinforcing member is provided in the gas interrupting portion, the pressure resistance of the reaction tube is improved.

In addition, it is preferable that the abovementioned gas interrupting portion is constituted from the wall of the abovementioned reaction tube. When the gas interrupting portion is constituted from the wall of the reaction tube, the configuration thereof is simplified.

In addition, it is preferable that the abovementioned gas interrupting portion is provided in the inner wall of the abovementioned reaction tube. Provision of the gas interrupting portion in the inner wall of the reaction tube allows for the effective utilization of known reaction tubes.

In addition, it is preferable that protruding portions is provided to protrude inward from an inner wall surface of the abovementioned reaction tube at, at least, an upper and a lower end of the abovementioned gas inlet tube and the abovementioned gas exhaust tube comprise.

When the upper end of the gas inlet tube comprises a protruding portion that protrudes inward from the inner wall surface of the reaction tube, flow of the process gas supplied from the gas inlet tube into the reaction tube above the reaction tube ceiling plate is inhibited. In addition, when the lower end of the gas inlet tube comprises a protruding portion that protrudes inward from the inner wall surface of the reaction tube, flow of the process gas supplied from the gas inlet tube into the reaction tube below the reaction tube bottom plate is inhibited. In addition, when both the upper end and the lower end of the gas inlet tube comprise protruding portions that protrude inward from the inner wall surface of the reaction tube, the structure is comparatively more simplified than when formed in a substrate holding tool in which substrates are disposed in plurality in a perpendicular direction to the substrate processing surface.

In addition, it is preferable that notched portions are provided in the same positions as in the protruding portions in a circumferential direction with respect to a processing surface of the substrates. The provision of notched portions in the same positions as in the protruding portions in a circumferential direction with respect to a processing surface of the substrates allows for a temperature detector to be housed in these notched portions.

In addition, it is preferable that a temperature detector for detecting a temperature within a processing chamber is housed in the abovementioned notched portions of the abovementioned protruding portions. Because a temperature detector for detecting a temperature within a processing chamber is housed in the notched portions of the protruding portions, the reproducibility of the positions in which the temperature detectors are provided is good, and stable temperature detection can be performed.

In addition, a second mode thereof provides a substrate processing apparatus comprising a cylindrical reaction tube having in an interior thereof a processing chamber in which a plurality of substrates disposed in a direction perpendicular to a substrate processing surface can be processed and a cylindrical heating device provided to surround an outer circumference of the reaction tube, a gas inlet tube and a gas exhaust tube being disposed on a side face of the abovementioned reaction tube so as to reach at least an outside of the abovementioned heating device.

Because both the reaction tube and the heating device are cylindrical in shape, improved uniformity of heating is achieved, and the substrate processing efficiency can be further improved. In addition, because the gas inlet tube and the gas exhaust tube are disposed on the side face of the reaction tube to reach at least the outside of the heating device, the diameter of the reaction tube is reduced, and a more reliable and ready flow of the gas across the substrates is produced. Accordingly, the in-plane and intersubstrate film thickness uniformity of a large number of substrates on which a film is being simultaneously formed is improved.

In addition, a third mode thereof provides a substrate processing apparatus comprising: a cylindrical reaction tube having in an interior thereof a processing chamber in which a plurality of substrates disposed in a direction perpendicular to a substrate processing surface can be processed; and a cylindrical heating device provided to surround an outer circumference of the reaction tube, a gas inlet tube being provided on a side face the abovementioned reaction tube in a region for processing a substrate inside the abovementioned reaction tube so as to reach at least the outside of the abovementioned heating device, and a gas spouting port being disposed in this gas inlet tube in a slit form so as to straddle at least a plurality of substrates in a direction perpendicular to the abovementioned substrate, for spouting gas from the gas inlet tube into the abovementioned processing chamber.

Because a gas inlet tube is disposed on a side face of the reaction tube in the region for processing the substrate inside the reaction, the gas flow supplied from the gas inlet tube into the reaction tube is formed as a side flow and, as a result, the substrate processing efficiency is improved.

Because a gas spouting port is disposed in the gas inlet tube in a slit form so as to straddle at least a plurality of the substrates in a direction perpendicular to the substrate processing surface for spouting gas from the gas inlet tube into the processing chamber, the amount of gas flowing across the substrates can be made uniform, and the in-plane and intersubstrate film thickness uniformity improved. In addition, because both the reaction tube and the heating device are cylindrical in shape, improved uniformity of heating is achieved, and the substrate processing efficiency can be further improved.

In addition, a method of manufacturing a semiconductor device for processing in use of the substrate processing apparatus of the first mode provides a method of manufacturing a semiconductor device comprising the steps of: conveying substrates into the abovementioned reaction tube; processing the substrates by introducing a gas from the abovementioned gas spouting port across the substrates within the abovementioned reaction tube while maintaining the gas flow velocity in the abovementioned gas inlet tube, and heating the abovementioned reaction tube by means of the abovementioned heating device; and conveying substrates out of the abovementioned reaction tube. Accordingly, the amount of gas flowing across the substrates can be made uniform, a uniform in-plane gas density and gas velocity can be supplied to the substrates, and the in-plane and intersubsrate film thickness uniformity improved.

In addition, a fourth mode provides a reaction vessel in cylindrical shape having in an interior thereof a processing chamber in which a plurality of substrates disposed in a direction perpendicular to a substrate processing surface can be processed, a gas inlet tube and a gas exhaust tube being provided on a side face of the abovementioned reaction tube in a region for processing the substrate inside the reaction tube, the gas inlet tube and the gas exhaust tube extending in a direction perpendicular to the side face of the reaction tube, and a gas spouting port being disposed in at least the gas inlet tube in a slit form so as to straddle at least a plurality of the substrates in a direction perpendicular to said substrate processing surface, for spouting gas from the abovementioned gas inlet tube into the abovementioned processing chamber.

Because the reaction tube is cylindrical in shape, the uniformity of the heating is improved, and the substrate processing efficiency is further improved. In addition, because a gas inlet tube and a gas exhaust tube are provided on the side face of the reaction tube, the diameter of the reaction tube is reduced, and the gas flows more readily and reliably across the substrates. Accordingly, the in-plane and intersubstrate film thickness uniformity of a plurality of substrates on which a film is simultaneously formed is improved.

In addition, because a gas spouting port is disposed in at least the gas inlet tube in a slit form so as to straddle at least a plurality of substrates in a direction perpendicular to said substrate processing surface, for spouting gas from the gas inlet tube into the processing chamber, the amount of gas flowing across the substrates can be made uniform, and the in-plane and intersubstrate film thickness uniformity improved.

In addition, it is preferable that in the first mode the width of the abovementioned spouting port in a direction horizontal to the abovementioned substrate processing surface is formed to be no more than ½ a diameter of the abovementioned substrates. The adoption of this configuration allows the gas to be spouted from the gas spouting port to pass across the center of the substrates at a velocity equivalent to the velocity at which the gas flows through the gas inlet tube.

In addition, it is preferable that in the first mode the width of the abovementioned spouting port in a direction horizontal to the abovementioned substrate processing surface is formed to be no more than $\frac{1}{15}$ a diameter of the abovementioned substrates. The adoption of this configuration ensures the amount of gas flowing across the substrates is made uniform, a uniform in-plane gas density and gas velocity is supplied to the substrates, and the in-plane and intersubsrate film thickness uniformity is improved.

In addition, a fifth mode provides a method of manufacturing a semiconductor device comprising the steps of: conveying a plurality of substrates disposed in a direction perpendicular to the substrate processing surface into the processing chamber; and processing the substrates by, in a substrate processing based on a gas flowing from a gas inlet tube across substrates being rotated in said processing chamber, causing the gas to arrive at a center portion of the abovementioned substrate processing surface of said substrates while maintaining the gas flow velocity of the abovementioned gas inlet tube. Accordingly, the amount of gas flowing across the substrates can be made uniform, a uniform in-plane gas density and gas velocity can be supplied to the substrates, and the in-plane and intersubsrate film thickness uniformity improved.

<<Description of an Embodiment in which the Processing Furnace of these Embodiments has Application>>

Figure 17:
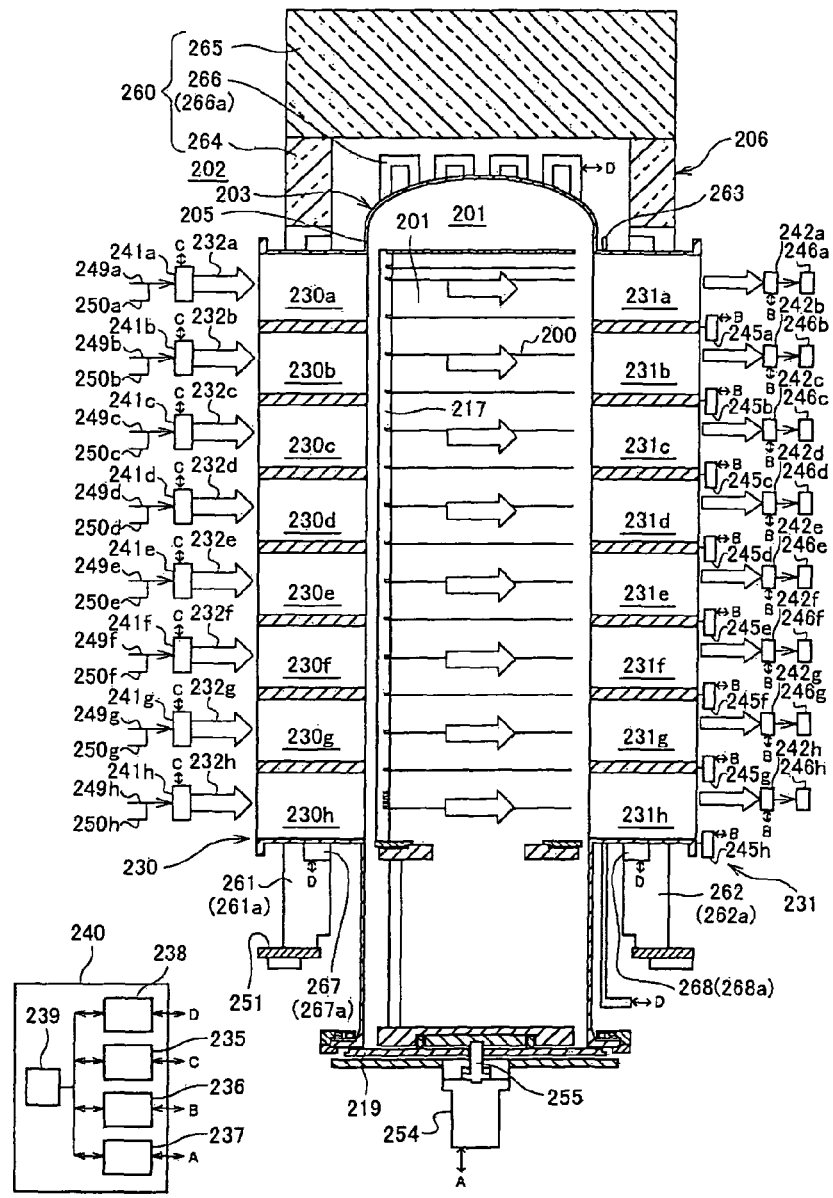
FIG. 17 is a schematic side view of a vertical-type semiconductor manufacturing apparatus as one embodiment of the present invention.
Figure 18:
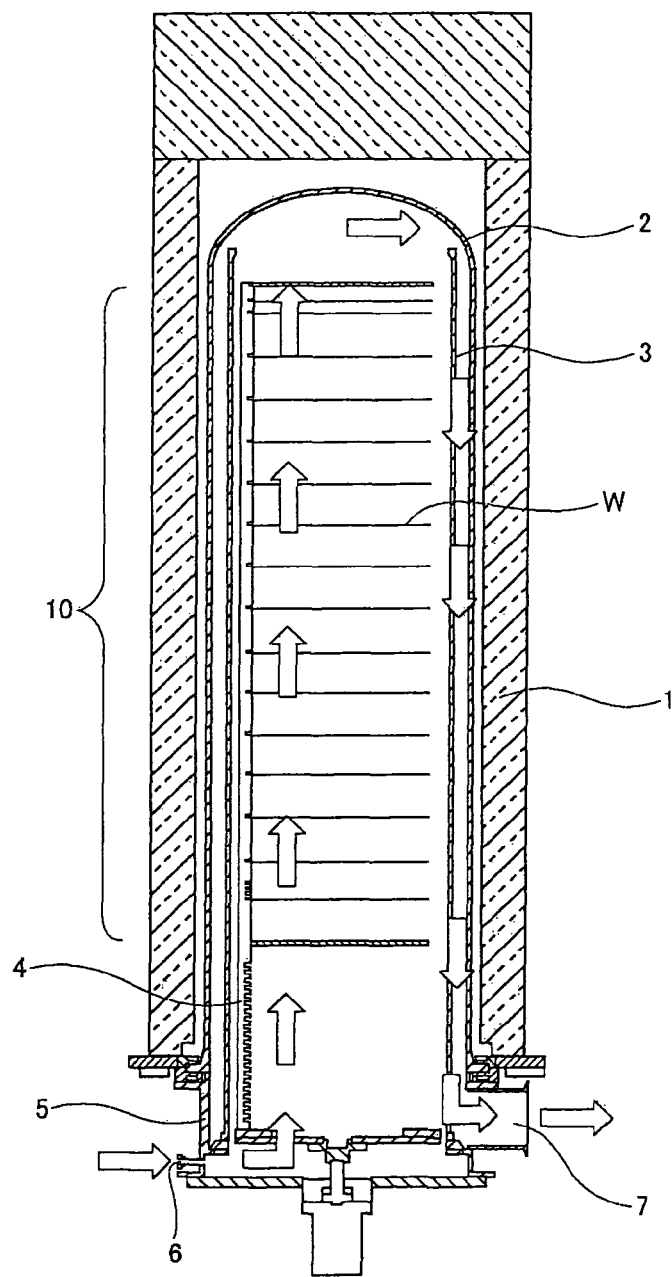
FIG. 18 is a schematic side view of a conventional vertical-type semiconductor manufacturing apparatus.
Figure 19:
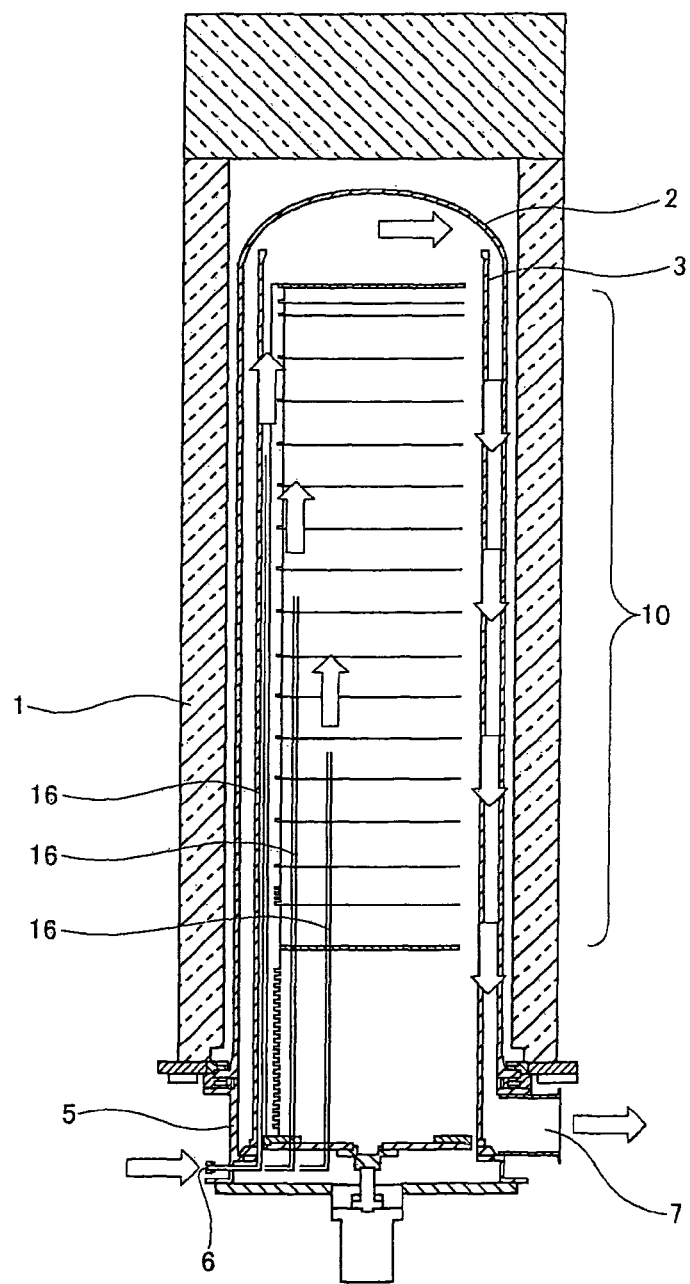
FIG. 19 is a schematic side view of a conventional vertical-type semiconductor manufacturing apparatus.
Figure 20:
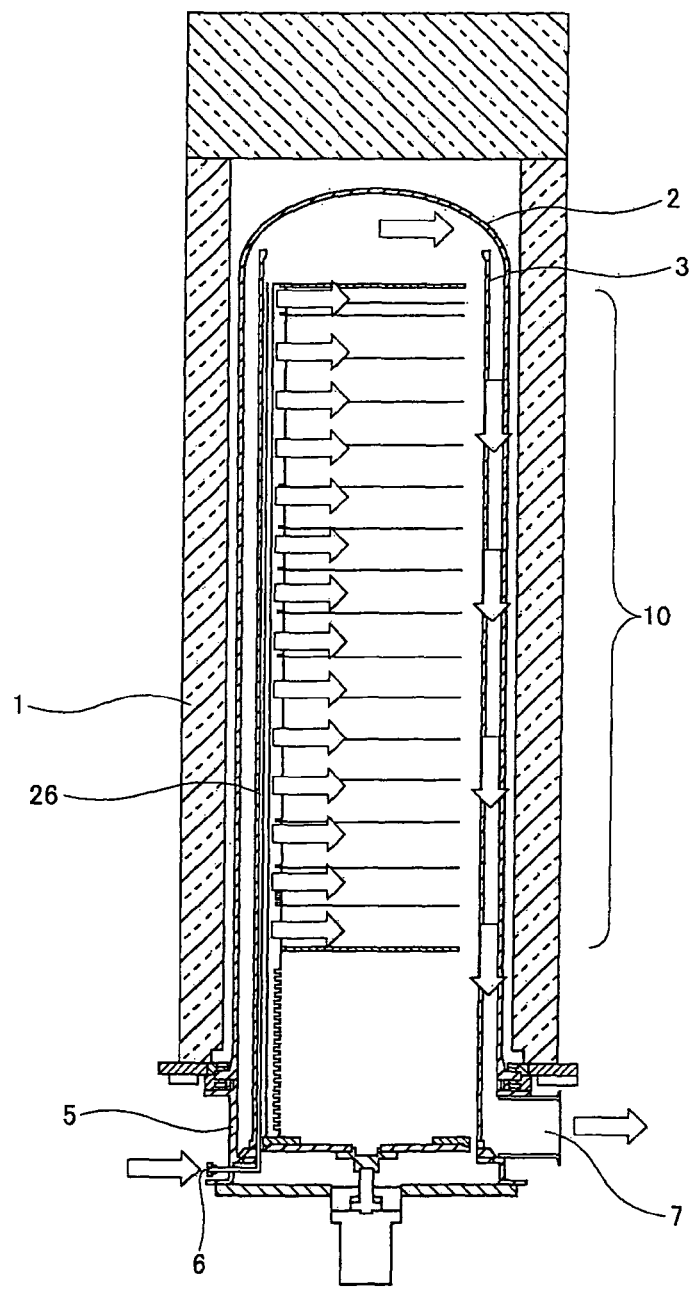
FIG. 20 is a schematic side view of a conventional vertical-type semiconductor manufacturing apparatus.
Figure 21:
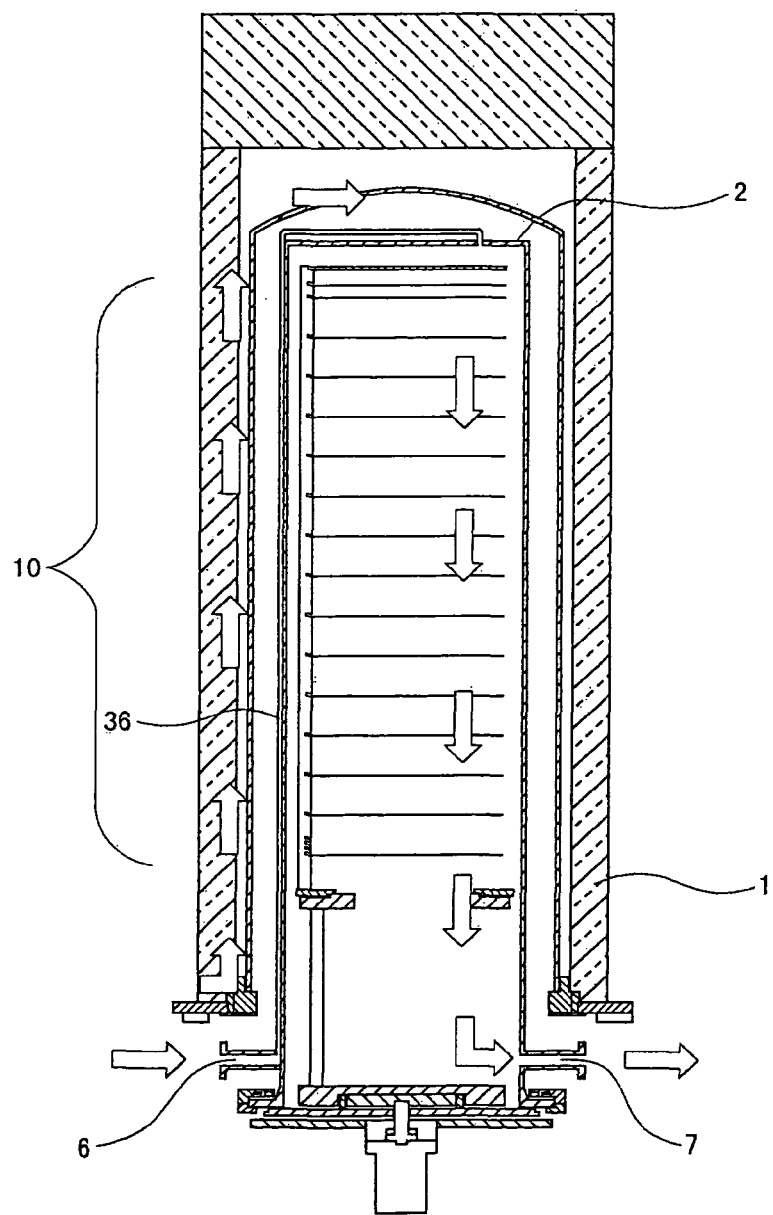
FIG. 21 is a schematic side view of a conventional vertical-type semiconductor manufacturing apparatus.

FIG. 17 is a schematic cross-sectional diagram of the processing furnace 202 of one embodiment of a substrate processing apparatus preferably employed in the embodiments of the present invention. The basic constituent elements of the processing furnace are the same as the corresponding constituent element of the processing furnace of the first embodiment described with reference to FIG. 1 and, accordingly, to avoid a repetition of the description thereof, the description given hereinafter pertains chiefly to the gas introduction system/gas exhaust system, the heater system and the control system thereof.

<<Gas Introduction System>>

Process gas supply portions 249a to 249h for supplying a process gas such as a film formation gas and first inert gas supply portions 250a to 250h for supplying a first inert gas such as an $N_2$ gas are connected by way of MFC (mass flow control units) 241a to 241h serving as gas flow rate control devices to the upstream side of each of a plurality of gas introduction partition portions 230a to 230h of a gas inlet tube 230. A gas flow rate control unit 235 is electrically connected to the MFC 241a to 241h.

The processing of wafers 200 within a reaction tube 203 involves supply of a process gas from the process gas supply portions 249a to 249h when the wafers 200 are disposed in a position opposing the gas introduction partition portions 230a to 230h and supply of an inert gas supplied from the first inert gas supply portions 250a to 250h when there are no wafers 200 disposed opposing the gas introduction partition portions 230a to 230h by the MFC 241a to 241h. The previously described gas control unit is constituted from the MFC 241a to 241h.

<<Gas Discharge System>>

Pressure sensors 245a to 245h serving as pressure detectors and, by way of pressure adjusting devices 242a to 242h, vacuum exhaust devices 246a to 246h such as vacuum pumps configured to vacuum exhaust the pressure of a processing chamber 201 to a predetermined pressure (vacuum degree)

are connected to the downstream side of each of a plurality of gas exhaust partition portions 231a to 231h of a gas exhaust tube 231. A pressure control unit 236 is electrically connected to the pressure adjusting devices 242a to 242h and the pressure sensors 245a to 245h, the pressure control unit 236 being configured so that the pressure in the processing chamber 201 is controlled by the pressure adjusting devices 242a to 242h in response to the pressure detected by the pressure sensors 245a to 245h at a predetermined timing.

<<Heater System>>

A heat-insulating body 260 of a heater 206 is constituted from a cylindrical side wall heat-insulating member 264, and a circular ceiling heat-insulating member 265 for closing an upper part of the side wall heat-insulating member 264.

A heater wire 266a serving as a first heat-insulating body 266 is provided between the side wall heat-insulating member 264 and the reaction tube 203. The heater wire 266a describes a zigzag shape and, similarly to the prior art, is provided in a ring shape that traces the inner wall of zones of the side wall heat-insulating member 264 which is zonally divided in the longitudinal direction.

A gas inlet tube side wall heat-insulating body 267a serving as a second heat-insulating body 267 is provided between a gas inlet tube notched portion 261a and the gas inlet tube 230. The gas inlet tube side wall heat-insulating body 267a is provided to trace the inner side wall of the gas inlet tube notched portion 261a.

A gas inlet tube side wall heat-insulating body 267a (sic) serving as a third heat-insulating body 268 is provided between a gas exhaust tube notched portion 262a and the gas exhaust tube 231. The gas exhaust tube side wall heat-insulating body 268a is provided to trace the inner side wall of the gas exhaust tube notched portion 262a.

The gas inlet tube side wall heat-insulating body 267a and gas exhaust tube side wall heat-insulating body 268a are provided to cover at least inner wall notched portions in the vicinity of the gas inlet tube 230 and the gas exhaust tube 231. The provision of these side wall heating members in the two opposing inner side walls of the gas inlet tube notched portion 261a and gas exhaust tube notched portion 262a rather that a single side wall is preferred, and the provision thereof in the inner upper wall of the gas inlet tube notched portion 261a or gas exhaust tube notched portion 262a is more preferred.

When the gas inlet tube side wall heat-insulating body 267a and gas exhaust tube side wall heat-insulating body 268a are preferably provided to span the zonally divided zones of the heater wire 266a, a more precise controllability is produced. A power supply for supplying power to the gas inlet tube side wall heat-insulating body 267a and the gas exhaust tube side wall heat-insulating body 268a provided as a separate power supply to the power supply for supplying power to the heater wire 266a.

<<Control System>>

The processing furnace control system executes the temperature control and other controls described hereinafter.

<<Temperature Control>>

A temperature sensor 263 serving as a temperature detector is disposed in the vicinity of the outer side of the reaction tube 203. A temperature control unit 238 electrically connected to the heater 206 and the temperature sensor 263 is configured to control the temperature in the processing chamber 201 at a predetermined timing to produce a desired temperature distribution by adjusting the current flowing to the heater 206 in accordance with temperature information detected by the temperature sensor 263. The temperature sensor 263 may employ a temperature sensor 270 as described in the third embodiment.

In addition, a temperature sensor 269 serving as a temperature detector is disposed in the gas inlet tube notched portion 261a (see FIG. 2 and FIG. 6). The temperature control unit 238 electrically connected to the gas inlet tube side wall heat-insulating body 267a and the temperature sensor is configured to control the temperature in the gas inlet tube 230 at a predetermined timing to produce a desired temperature distribution by adjusting the current flowing to the gas inlet tube side wall heat-insulating body 267a in accordance with temperature information detected by the temperature sensor.

Furthermore, a temperature sensor 270 serving as a temperature detector is disposed in the gas exhaust tube notched portion 262a (see FIG. 2 and FIG. 6). The temperature control unit 238 electrically connected to the gas exhaust tube side wall heat-insulating body 268a and the temperature sensor is configured to control the temperature in the gas exhaust tube 231 at a predetermined timing to produce a desired temperature distribution by adjusting the current flowing to the gas exhaust tube side wall heat-insulating body 268a in accordance with temperature information detected by the temperature sensor.

The temperature control unit 238 is configured to control each of the above-described heater wire 266a, gas inlet tube side wall heat-insulating body 267a and gas exhaust tube side wall heat-insulating body 268a using different systems.

A drive control unit 237 electrically connected to a rotary mechanism 254 and port elevator is configured to execute a control for implementing desired operations at desired timings.

<<Other Controls>>

The gas flow rate control unit 235, pressure control unit 236, drive control unit 237 and temperature control unit 238 are electrically connected to a main control unit 239 constituted additionally from an operating unit and an input/output unit for controlling the substrate processing apparatus in its entirety. The gas flow rate control unit 235, pressure control unit 236, drive control unit 237, temperature control unit 238 and main control unit 239 are configured as a controller 240.

The processing furnace 202 of the embodiments is configured as described above.

<<Example Processing Conditions>>

As an example of the processing conditions for processing wafers in the processing furnace of the embodiments for the film formation of a $Si_3N_4$ film includes a processing pressure of 30 Pa, the employment of dichlorosilane gas ($SiH_2Cl_2$) and ammonia gas ($NH_3$) as the gas types, and a gas supply flow rate to the partition portions of $SiH_2Cl_2$ 0.1 sccm and $NH_3$ 0.5 sccm may be employed. The conditions additionally include a processing temperature in the reaction tube 203 heated by the heater wire 266a of 760° C., a temperature in the gas inlet tube 230 heated by the gas inlet tube side wall heating body 267a of 300° C., and a temperature of the gas exhaust tube 231 heated by the gas exhaust tube side wall heating body 268a of 300° C.

The wafer processing is administered p with each of these respective processing conditions maintained to a constant value within a respective range thereof.

The invention claimed is:

1. A method of manufacturing a semiconductor device, comprising the steps of:
    conveying a plurality of substrates disposed in a direction perpendicular to a substrate processing surface into a processing chamber provided inside of a reaction tube, with an outer periphery surrounded by a heating device; and
    processing the substrates by introducing a process gas or an inert gas to a gas inlet tube provided on a side face of the reaction tube in a region for processing the substrates inside the reaction tube, so as to reach at least an outside of the heating device, and spouting the process gas or the inert gas into the processing chamber from a gas spouting port disposed in a form so as to straddle at least a plurality of the substrates in a direction perpendicular to the substrate processing surface and having an opening area identical to a cross-sectional area of the gas inlet tube in the direction perpendicular to the substrate processing surface.

2. The method of manufacturing a semiconductor device according to claim 1, wherein in the step of processing the substrates, the process gas or the inert gas is introduced to a plurality of gas inlet partition portions provided in the gas inlet tube so as to be partitioned in a direction perpendicular to the substrate processing surface, and the process gas or the inert gas is spouted into the processing chamber from the gas spouting port provided in each of the plurality of gas inlet partition portions in a form so as to straddle at least a plurality of the substrates in a direction perpendicular to the substrate processing surface and having an opening area identical to a cross-sectional area of the corresponding gas inlet partition portion in the direction perpendicular to the substrate processing surface.

3. The method of manufacturing a semiconductor device according to claim 2, wherein in the step of processing the substrates,
the gas is supplied into the processing chamber from the gas spouting port, in the gas inlet partition portion, in which the substrates are disposed at an opposed position, out of the plurality of gas inlet partition portions; and
inert gas is supplied into the processing chamber from the gas spouting port in the gas inlet partition portion, in which the substrates are not disposed at the opposed position, out of the plurality of gas inlet partition portions.

4. The method of manufacturing a semiconductor device according to claim 1, wherein in the step of processing the substrates, gas in the processing chamber is exhausted from a exhaust port in a form so as to straddle at least a plurality of the substrates in a direction perpendicular to the substrate processing surface, to a gas exhaust tube provided on a side face of the reaction tube in a region for processing the substrates inside of the reaction tube.

5. The method of manufacturing a semiconductor device according to claim 4, wherein in the step of processing the substrates, the gas is exhausted to the gas exhaust tube provided on a side face of the reaction tube, so as to reach at least an outside of the heating device.

6. The method of manufacturing a semiconductor device according to claim 5, wherein in the step of processing the substrates, the gas in the processing chamber is exhausted to the plurality of exhaust partition portions from the exhaust port provided in each of the plurality of gas exhaust partition portions provided in the gas exhaust tube so as to be partitioned in a direction perpendicular to the substrate processing surface.

7. The method of manufacturing a semiconductor device according to claim 5, wherein in the step of processing the substrates, the substrates are processed in a state of reducing a gas flow space by protruding portions protruded inward from an inner wall surface of the reaction tube provided at least on upper ends of the gas inlet tube and the gas exhaust tube.

8. The method of manufacturing a semiconductor device according to claim 5, wherein in the step of processing the substrates, the substrates are processed in a state of supplying inert gas from an upper side and a lower side of the reaction tube in a region excluding a region in which the substrates are disposed, being an inside of the reaction tube.

9. The method of manufacturing a semiconductor device according to claim 5, wherein in the step of processing the substrates, the substrates are processed in a state of preventing flow of the gas to an upper side of the reaction tube by a gas interrupting portion provided in the upper side of the reaction tube.

10. The method of manufacturing a semiconductor device according to claim 6, wherein in the step of processing the substrates, the substrates are processed in a state of suppressing a gas flow to inside/outside the partition portions, by a ring protruded inward from an inner wall of the reaction tube provided in the gas inlet partition portions and the gas exhaust partition portions.

11. A method of manufacturing a semiconductor device, comprising the steps of:
conveying a substrate holding tool in which a plurality of substrates are disposed in a direction perpendicular to a substrate processing surface into a processing chamber provided inside of a reaction tube, with an outer periphery surrounded by a heating device; and
processing the substrates by introducing a process gas or an inert gas to a gas inlet tube provided on a side face of the reaction tube in a region for processing the substrates inside the reaction tube, so as to reach at least an outside of the heating device, and exhausting the gas in the processing chamber from an exhaust port to a gas exhaust tube provided on a side face of the reaction tube in a region for processing the substrates, being an inside of the reaction tube, while spouting the process gas or the inert gas into the processing chamber from a gas spouting port,
wherein in the step of processing the substrates, the substrates are processed in a state of reducing a flow of the process gas or the inert gas to the upper space of the substrate holding tool by a protruding portion protruded toward an upper end of the substrate holding tool from an inner wall surface of the reaction tube provided on at least upper ends of the gas inlet tube and the gas exhaust tube.

12. The method of manufacturing a semiconductor substrate according to claim 11, wherein in the step of processing the substrates, the gas is introduced to a plurality of gas inlet partition portions provided in the gas inlet tube so as to be partitioned in a direction perpendicular to the substrate processing surface; the gas in the processing chamber is exhausted to the plurality of gas exhaust partition portions from the gas exhaust port provided in each of a plurality of gas exhaust partition portions provided in the gas exhaust tube so as to be partitioned in a direction perpendicular to the substrate processing surface, while spouting the gas into the processing chamber from the gas spouting port provided in each of the plurality of gas inlet partition portions.

13. The method of manufacturing a semiconductor device according to claim 12, wherein in the step of processing the substrates, the substrates are processed, in a state of suppressing a gas flow to inside/outside the partition portions, by a ring protruded inward from an inner wall surface of the reaction tube provided in the gas inlet partition portions and the gas exhaust partition portions.

14. A method of manufacturing a semiconductor device, comprising the steps of:
conveying a substrate holding tool in which a plurality of substrates are disposed in a direction perpendicular to a substrate processing surface into a processing chamber provided inside of a reaction tube, with an outer periphery surrounded by a heating device; and processing the substrates by introducing a process gas or an inert gas to a gas inlet tube provided on a side face of the reaction tube in a region for processing the substrates inside the reaction tube, so as to reach at least an outside of the heating device, and exhausting the process gas or the inert gas in the processing chamber from an exhaust port to a gas exhaust tube provided on a side face of the reaction tube in a region for processing the substrates, being an inside of the reaction tube, while spouting the process gas or the inert gas into the processing chamber from a gas spouting port, wherein in the step of processing the substrates, a temperature in the processing chamber is detected by a temperature detector accommodated in a notched portion provided in the protruded portion, while reducing a flow of the process gas or the inert gas to the upper space of the substrate holding tool by a protruding portion protruded toward an upper end of the substrate holding tool from an inner wall surface of the reaction tube provided on at least upper ends of the gas inlet tube and the gas exhaust tube, and based on the detected temperature, the heating device is controlled.

15. The method of manufacturing a semiconductor device according to claim 14, wherein in the step of processing the substrates, the process gas or the inert gas is introduced to a plurality of gas inlet partition portions provided in the gas inlet tube so as to be partitioned in a direction perpendicular to the substrate processing surface;

then the process gas or the inert gas in the processing chamber is exhausted to the plurality of gas exhaust partition portions from the exhaust port provided in each of a plurality of gas exhaust partition portions provided in the gas exhaust tube so as to be partitioned in a direction perpendicular to the substrate processing surface, while spouting the process gas or the inert gas into the processing chamber from the gas spouting port provided in each of the plurality of gas inlet partition portions; and the substrates are processed in a state of suppressing a gas flow to inside/outside of the partition portions, by a ring protruded inward from an inner wall of the reaction tube provided in the gas inlet partition portions and the gas exhaust partition portions.

* * * * *